United States Patent
Lin et al.

(10) Patent No.: US 10,269,722 B2
(45) Date of Patent: Apr. 23, 2019

(54) WIRING BOARD HAVING COMPONENT INTEGRATED WITH LEADFRAME AND METHOD OF MAKING THE SAME

(71) Applicant: BRIDGE SEMICONDUCTOR CORP., Taipei (TW)

(72) Inventors: Charles W. C. Lin, Singapore (SG); Chia-Chung Wang, Hsinchu County (TW)

(73) Assignee: BRIDGE SEMICONDUCTOR CORP., Taipei (TW)

( * ) Notice: Subject to any disclaimer, the term of this patent is extended or adjusted under 35 U.S.C. 154(b) by 0 days.

(21) Appl. No.: 15/919,847

(22) Filed: Mar. 13, 2018

(65) Prior Publication Data

US 2018/0204802 A1    Jul. 19, 2018

Related U.S. Application Data

(63) Continuation-in-part of application No. 15/283,305, filed on Oct. 1, 2016, now Pat. No. 9,947,625, which
(Continued)

(51) Int. Cl.
*H01L 21/48* (2006.01)
*H01L 23/538* (2006.01)
(Continued)

(52) U.S. Cl.
CPC ........ *H01L 23/5389* (2013.01); *H01L 21/486* (2013.01); *H01L 21/4821* (2013.01); *H01L 21/4857* (2013.01); *H01L 21/561* (2013.01); *H01L 21/6835* (2013.01); *H01L 23/3121* (2013.01); *H01L 23/36* (2013.01); *H01L 23/4334* (2013.01); *H01L 23/49861* (2013.01); *H01L 23/5383* (2013.01); *H01L 23/5384* (2013.01); *H01L 23/5386* (2013.01); *H01L 24/16* (2013.01); *H01L 24/19* (2013.01);
(Continued)

(58) Field of Classification Search
CPC ............ H01L 23/4334; H01L 23/5389; H01L 21/486; H01L 21/52; H01L 21/6835; H01L 21/3121; H01L 21/4821; H05K 1/0271; H05K 3/4682; H05K 3/183
USPC ................................................. 174/250–268
See application file for complete search history.

(56) References Cited

U.S. PATENT DOCUMENTS 6,570,248 B1    5/2003    Ahn et al.
7,851,269 B2   12/2010   Muthukumar et al.
(Continued)

*Primary Examiner* — Steven T Sawyer
(74) *Attorney, Agent, or Firm* — Muncy, Geissler, Olds & Lowe, P.C.

(57) ABSTRACT

A wiring board includes an electronic component laterally surrounded by a leadframe, and first and second buildup circuitries disposed beyond the space laterally surrounded by the leadframe and extending over the leadframe. The electronic component includes a first routing circuitry, an encapsulant, optionally an array of vertical connecting elements and optionally a second routing circuitry integrated together. The first routing circuitry provides primary routing for the semiconductor device, whereas the first and second buildup circuitries not only provides further routing, but also mechanically binds the electronic component with the leadframe. The leadframe provides electrical connection between the first buildup circuitry and the second buildup circuitry.

12 Claims, 20 Drawing Sheets

Related U.S. Application Data is a continuation-in-part of application No. 14/746,792, filed on Jun. 22, 2015, now abandoned.

(60) Provisional application No. 62/092,196, filed on Dec. 15, 2014, provisional application No. 62/121,450, filed on Feb. 26, 2015.

(51) Int. Cl.
*H01L 23/00* (2006.01)
*H01L 25/16* (2006.01)
*H01L 21/683* (2006.01)
*H01L 21/56* (2006.01)
*H01L 25/065* (2006.01)
*H01L 23/31* (2006.01)
*H01L 23/498* (2006.01)
*H01L 23/36* (2006.01)
*H01L 23/433* (2006.01)
*H01L 23/367* (2006.01)

(52) U.S. Cl.
CPC ............. *H01L 24/20* (2013.01); *H01L 24/32* (2013.01); *H01L 24/73* (2013.01); *H01L 24/81* (2013.01); *H01L 24/97* (2013.01); *H01L 25/0652* (2013.01); *H01L 25/0657* (2013.01); *H01L 25/16* (2013.01); *H01L 21/568* (2013.01); *H01L 23/3128* (2013.01); *H01L 23/367* (2013.01); *H01L 23/3675* (2013.01); *H01L 2221/68359* (2013.01); *H01L 2221/68381* (2013.01); *H01L 2224/16227* (2013.01); *H01L 2224/211* (2013.01); *H01L 2224/214* (2013.01); *H01L 2224/221* (2013.01); *H01L 2224/32245* (2013.01); *H01L 2224/73253* (2013.01); *H01L 2224/81005* (2013.01); *H01L 2225/06517* (2013.01); *H01L 2225/06548* (2013.01); *H01L 2225/06555* (2013.01); *H01L 2225/06572* (2013.01); *H01L 2924/19102* (2013.01); *H01L 2924/19105* (2013.01)

(56) References Cited

U.S. PATENT DOCUMENTS

| | | | |
|---|---|---|---|
| 7,902,660 | B1 | 3/2011 | Lee et al. |
| 7,981,728 | B2 | 7/2011 | Cho |
| 8,227,703 | B2 | 7/2012 | Maruyama et al. |
| 8,453,323 | B2 | 6/2013 | Sakamoto et al. |
| 8,501,544 | B2 | 8/2013 | Pagaila |
| 8,525,337 | B2 | 9/2013 | Pendse |
| 8,536,715 | B2 | 9/2013 | Chino |
| 8,618,652 | B2 | 12/2013 | Nalla et al. |
| 8,836,114 | B2 | 9/2014 | Oh et al. |
| 8,952,526 | B2 | 2/2015 | Lin et al. |
| 2006/0043568 | A1 | 3/2006 | Abe et al. |
| 2008/0308950 | A1 | 12/2008 | Yoo et al. |
| 2010/0025081 | A1 | 2/2010 | Arai et al. |
| 2011/0049695 | A1 | 3/2011 | Shin et al. |
| 2011/0291249 | A1 | 12/2011 | Chi et al. |
| 2011/0291288 | A1* | 12/2011 | Wu .................... H01L 24/17 257/774 |
| 2012/0056329 | A1 | 3/2012 | Pagaila et al. |
| 2012/0061814 | A1* | 3/2012 | Camacho ............ H01L 21/4853 257/676 |
| 2013/0271929 | A1 | 10/2013 | Malatkar et al. |
| 2015/0084206 | A1 | 3/2015 | Lin |

\* cited by examiner

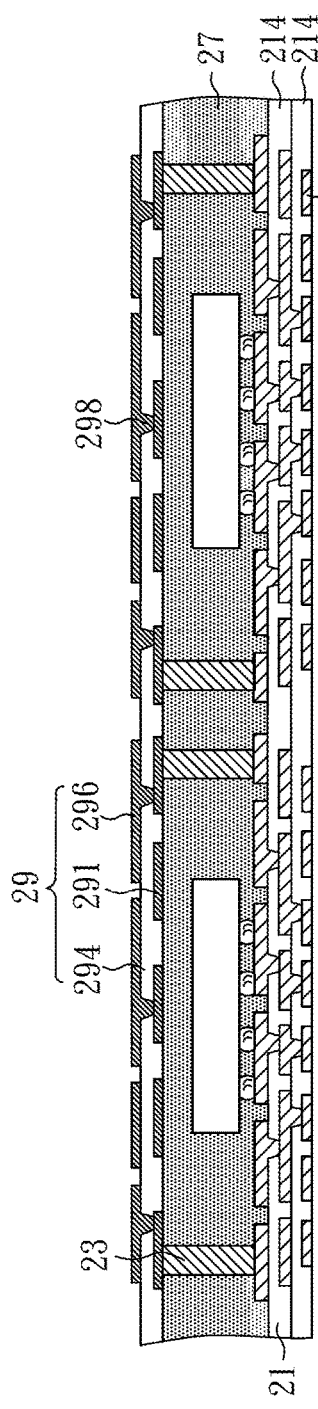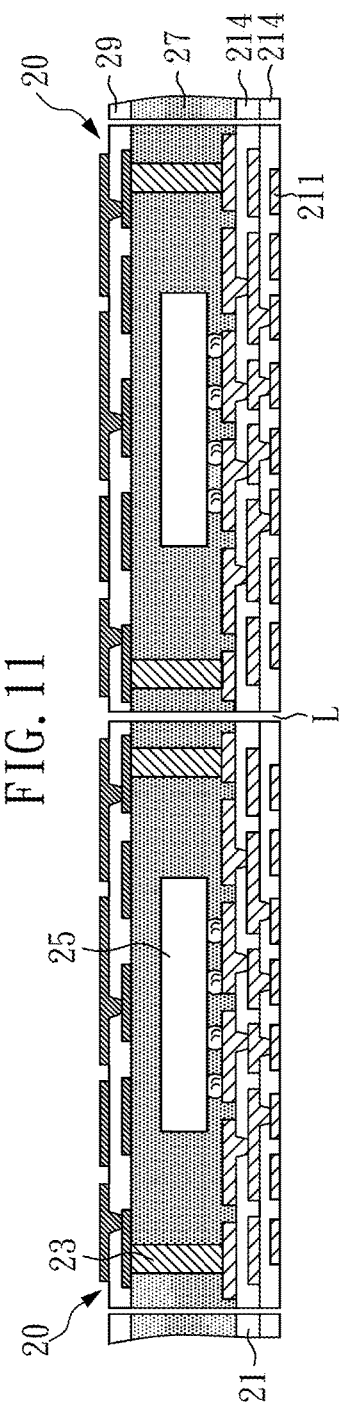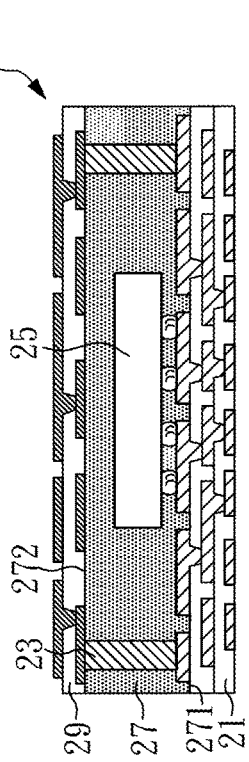

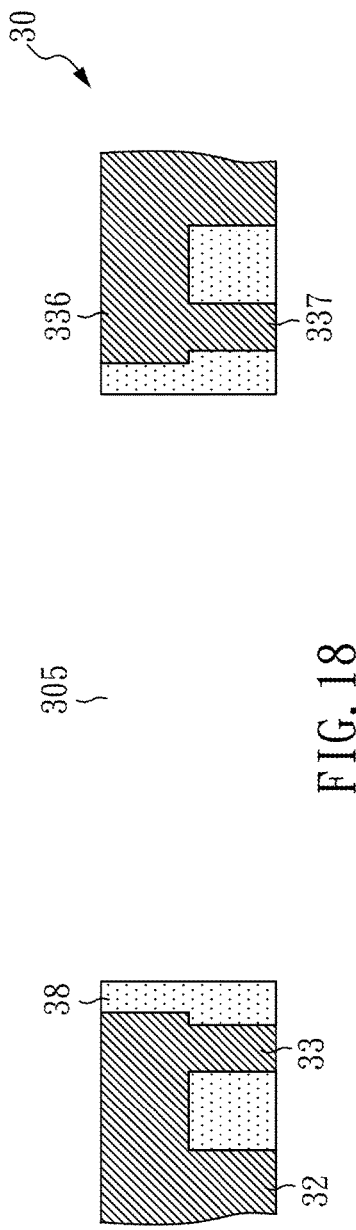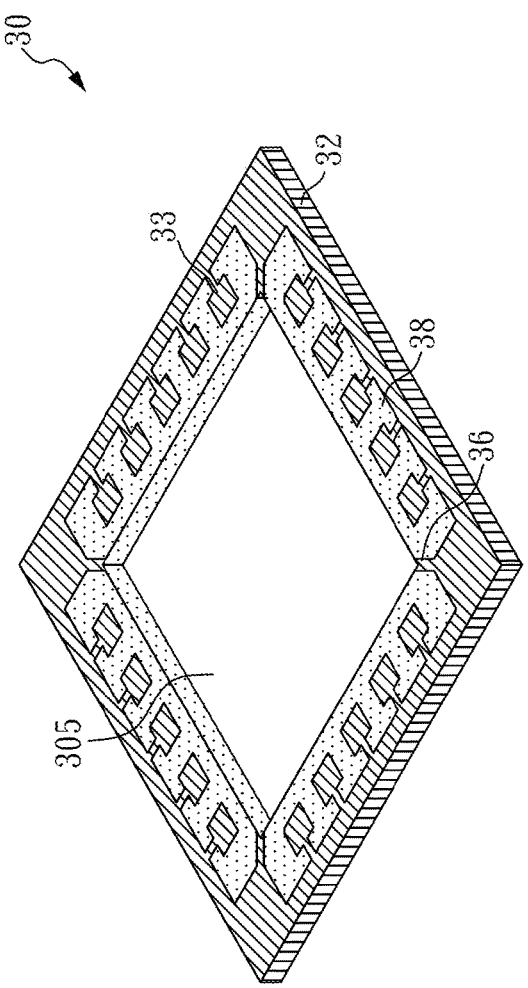
FIG. 18
FIG. 19

WIRING BOARD HAVING COMPONENT INTEGRATED WITH LEADFRAME AND METHOD OF MAKING THE SAME

CROSS REFERENCE TO RELATED APPLICATIONS

This application is a continuation-in-part of U.S. application Ser. No. 15/283,305 filed Oct. 1, 2016. The U.S. application Ser. No. 15/283,305 is a continuation-in-part of U.S. application Ser. No. 14/746,792 filed Jun. 22, 2015, now abandoned. The U.S. application Ser. No. 14/746/792 claims the priority benefit of U.S. Provisional Application Ser. No. 62/092,196 filed Dec. 15, 2014, now expired, and the priority benefit of U.S. Provisional Application Ser. No. 62/121,450 filed Feb. 26, 2015, now expired. The entirety of each of said Applications is incorporated herein by reference.

FIELD OF THE INVENTION

The present invention relates to a wiring board and, more particularly, to a wiring board having a component integrated with a leadframe, and a method of making the same.

DESCRIPTION OF RELATED ART

The convergence of mobility, communication, and computing has created significant performance and dimension challenges to the semiconductor packaging industry. Packaging technologies such as BGA QFN and WLP have been developed extensively, but none of these technologies can meet the high performance requirements at cost. For example, the design concept of the microBGA or QFN is to use a robust metal frame together with conventional wire bonding to achieve size and cost reduction purposes. Since the etching-formed metal leads have limited routing capability, the QFN or microBGA package is not suitable for high performance, high input/output (I/O) devices.

Integrating an electronic device such as resistor, capacitor, memory or a logic chip in a circuit board can potentially improve the electrical performance of the semiconductor assembly and reduce dimension. U.S. Pat. Nos. 8,453,323, 8,525,337, 8,618,652 and 8,836,114 disclose various wiring boards for such purposes. However, as the resin-based boards lack of rigidity support, having a CTE-mismatched device embedded therein can worsen the situation and cause serious problems in warpage control and misalignment. Furthermore, as the vertical connections of these boards are typically through plated-through-holes or staggered metallized vias, potential problems include discontinuity in signal transmission and poor reliability.

For the reasons stated above, and for other reasons stated below, an urgent need exists to develop a new wiring board having embedded device integrated with surrounding leadframe that can address ultra-high packaging density, high signal integrity and low warpage demands.

SUMMARY OF THE INVENTION

A primary objective of the present invention is to provide a core substrate of a wiring board having a leadframe surrounding an electronic component, and the electronic component includes a first routing circuitry, an embedded device, an encapsulant, optionally an array of vertical connecting elements and optionally a second routing circuitry. As the rigidity of the core substrate is fortified by the surrounding metal leads of the leadframe, warping and bending of the board can be suppressed, thereby improving production yield and device-level reliability.

The wiring board of the present invention further includes a first buildup circuitry and a second buildup circuitry disposed on both sides of the core substrate. The first routing circuitry and the first buildup circuitry provide dual-staged horizontal routing for the embedded device, and metal leads of the leadframe provide vertical connecting channels for the first and second buildup circuitries, thereby improving design flexibility, signal integrity and the electrical characteristics of the semiconductor assembly.

In accordance with the foregoing and other objectives, the present invention provides a wiring board that includes a first routing circuitry, a semiconductor device, an encapsulant, optionally an array of vertical connecting elements, optionally a second routing circuitry, a leadframe, a first buildup circuitry and a second buildup circuitry. The first routing circuitry, the semiconductor device, the encapsulant, the optional vertical connecting elements and the optional second routing circuitry are integrated as an electronic component surrounded by the leadframe. In a preferred embodiment, the leadframe, located around peripheral edges of the electronic component, provides metal leads as vertical connecting channels between the first buildup circuitry and the second buildup circuitry; the semiconductor device, flip-chip mounted on the first routing circuitry, is sealed in the encapsulant; the first routing circuitry, adjacent, to one side of the encapsulant, provides primary routing/interconnection for the semiconductor device; the optional second routing circuitry, adjacent to the other side of the encapsulant, provides further routing/interconnection; the optional vertical connecting elements, positioned between the first and second routing circuitries, offers electrical connection between the first routing circuitry and the second routing circuitry; and the first buildup circuitry and the second buildup circuitry, respectively disposed at two opposite sides of the electronic component and the leadframe, are electrically connected to each other through the metal leads of the leadframe and mechanically binds the electronic component with the leadframe and provides further fan-out routing.

In another aspect, the present invention provides a wiring board, comprising: an electronic component that includes a semiconductor device, a first routing circuitry and an encapsulant, wherein the semiconductor device is electrically coupled to the first muting circuitry and laterally covered by the encapsulant, and the encapsulant has a first surface facing in the first routing circuitry and a second surface opposite to the first surface; a leadframe that laterally surrounds the electronic component and includes a plurality of metal leads and a binding resin, wherein the binding resin fills in spaces between the metal leads; a first buildup circuitry that is disposed over the first routing circuitry and laterally extends over the leadframe, wherein the first buildup circuitry includes at least one dielectric layer and at least one wiring layer in an alternate fashion, and the wiring layer of the first buildup circuitry is electrically coupled to the first routing circuitry and the metal leads; and a second buildup circuitry that is disposed over the second surface of the encapsulant and laterally extends over the leadframe, wherein the second buildup circuitry includes at least one dielectric layer and at least one wiring layer in an alternate fashion, and the wiring layer of the second buildup circuitry is electrically coupled to the metal leads.

In yet another aspect, the present invention provides a method of making a wiring, board, comprising steps of: providing an electronic component that includes a semiconductor device, a first routing circuitry and an encapsulant, wherein the semiconductor device is electrically coupled to the first routing circuitry and laterally covered by the encapsulant, and the encapsulant has a first surface facing in the first muting circuitry and a second surface opposite to the first surface; providing a leadframe that laterally surrounds the electronic component and includes a plurality of metal leads and a binding resin, wherein the binding resin fills in spaces between the metal leads; forming a first buildup circuitry that is disposed over the first routing circuitry and laterally extends over the leadframe, wherein the first buildup circuitry includes at least one dielectric layer and at least one wiring layer in an alternate fashion, and the wiring layer of the first buildup circuitry is electrically coupled to the first routing circuitry and the metal leads; and forming a second buildup circuitry that is disposed over the second surface of the encapsulant and laterally extends over the leadframe, wherein the second buildup circuitry includes at least one dielectric layer and at least one wiring layer in an alternate fashion, and the wiring layer of the second buildup circuitry is electrically coupled to the metal leads.

Unless specifically indicated or using the term "then" between steps, or steps necessarily occurring in a certain order, the sequence of the above-mentioned steps is not limited to that set forth above and may be changed or reordered according to desired design.

The method of making a wiring board according to the present invention has numerous advantages. For instance, providing the leadframe surrounding the electronic component is particularly advantageous as the metal leads of the leadframe can offer horizontal routing and vertical connecting channels between the first buildup circuitry and the second buildup circuitry. Combining the electronic component with the leadframe can provide a stable platform for forming the first buildup circuitry and the second buildup circuitry thereon. Forming the encapsulant on the first routing circuitry can provides a high modulus anti-warping platform for the wiring board, so that the warping after removal of the sacrificial carrier can be suppressed by the mechanical robustness of the encapsulant and the leadframe. Additionally, the multi-stage formation of the wiring board can avoid serious warping problem when multiple layers of routing circuitries are needed.

These and other features and advantages of the present invention will be further described and more readily apparent from the detailed description of the preferred embodiments which follows.

BRIEF DESCRIPTION OF THE DRAWINGS

The following detailed description of the preferred embodiments of the present invention can best be understood when read in conjunction with the following drawings, in which:

FIG. 11 is a cross-sectional view of the structure of FIG. 10 after removal of the sacrificial carrier in accordance with the first embodiment of the present invention;

FIG. 12 is a cross-sectional view of a diced state of the panel-scale structure of FIG. 11 in accordance with the first embodiment of the present invention;

FIG. 13 is a cross-sectional view of an electronic component corresponding to a diced unit in FIG. 12 in accordance with the first embodiment of the present invention;

FIGS. 18 and 19 are cross-sectional and top perspective views, respectively, of the structure of FIGS. 16 and 17 formed with a through opening to finish the fabrication of a leadframe in accordance with the first embodiment of the present invention;

DETAILED DESCRIPTION OF THE PREFERRED EMBODIMENTS

Hereafter, examples will be provided to illustrate the embodiments of the present invention. Advantages and effects of the invention will become more apparent from the disclosure of the present invention. It should be noted that these accompanying figures are simplified and illustrative. The quantity, shape and size of components shown in the figures may be modified according, to practical conditions, and the arrangement of components may be more complex. Other various aspects also may be practiced or applied in the invention, and various modifications and variations can be made without departing from the spirit of the invention based on various concepts and applications.

[Embodiment 1]

FIGS. 1-25 are schematic views showing a method of making an untrimmed wiring board that includes an electronic component, a leadframe, a first buildup circuitry and a second buildup circuitry in accordance with the first embodiment of the present invention.

Figure 1:
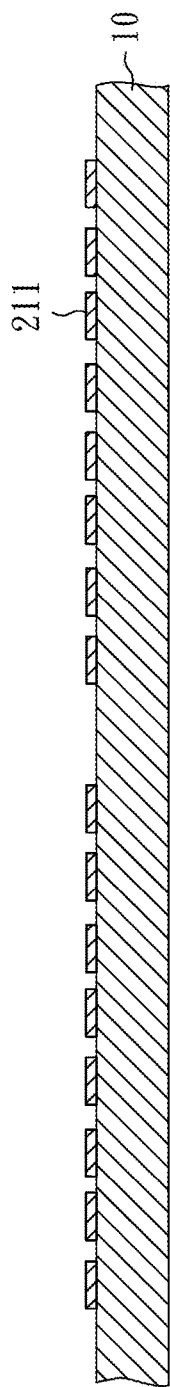
FIGS. 1 and 2 are cross-sectional and top perspective views, respectively, of the structure with a routing layer formed on a sacrificial carrier in accordance with the first embodiment of the present invention.
Figure 2:
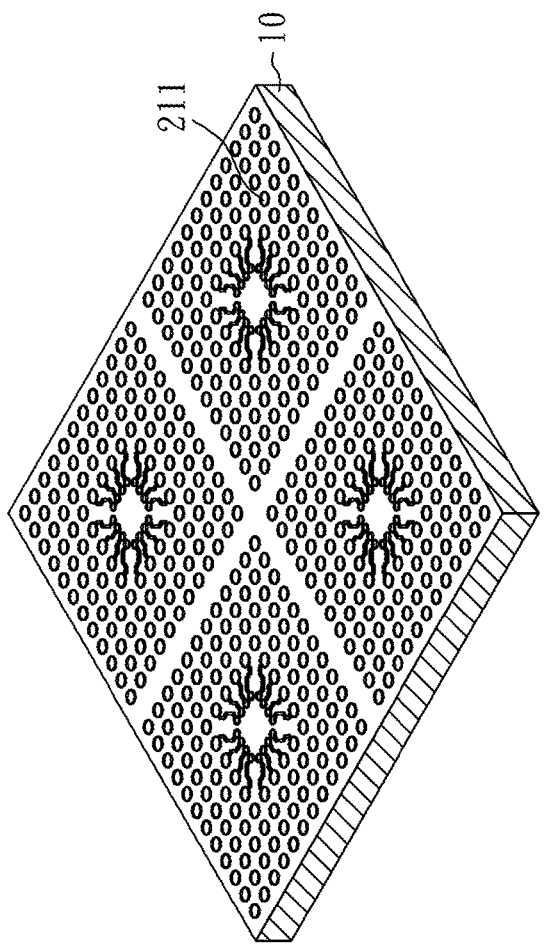

FIGS. 1 and 2 are cross-sectional and top perspective views, respectively, of the structure with a routing layer 211 formed on a sacrificial carrier 10 by metal deposition and metal patterning process. The sacrificial carrier 10 typically is made of copper, aluminum, iron, nickel, tin, stainless steel, silicon, or other metals or alloys, but any other conductive or non-conductive material also may be used. The thickness of the sacrificial carrier 10 preferably ranges from 0.1 to 2.0 mm. In this embodiment, the sacrificial carrier 10 is made of an iron-based material and has a thickness of 1.0 mm. The routing layer 211 typically is made of copper and can be pattern deposited by numerous techniques, such as electroplating, electroless plating, evaporating, sputtering or their combinations, or be thin-film deposited followed by a metal patterning process. For a conductive sacrificial carrier 10, the routing layer 211 is deposited typically by plating of metal. The metal patterning techniques include wet etching, electro-chemical etching, laser-assist etching, and their combinations with an etch mask (not shown) thereon that defines the routing layer 211.

Figure 3:
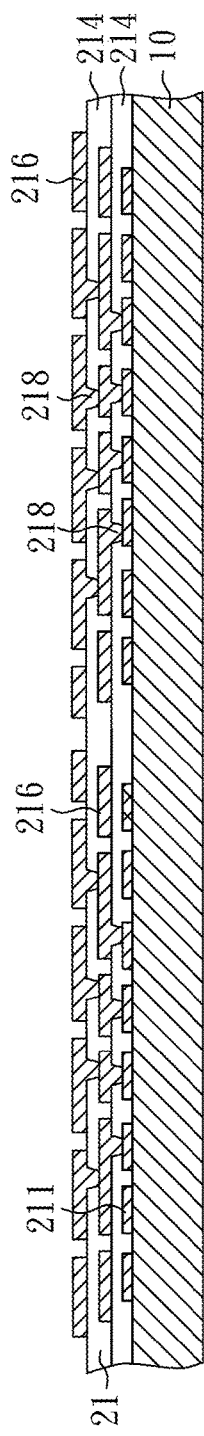
FIGS. 3 and 4 are cross-sectional and top perspective views, respectively, of the structure of FIGS. 1 and 2 further provided with multiple dielectric layers and multiple conductive trace layers to finish the formation of a first routing circuitry on the sacrificial carrier in accordance with the first embodiment of the present invention.
Figure 4:
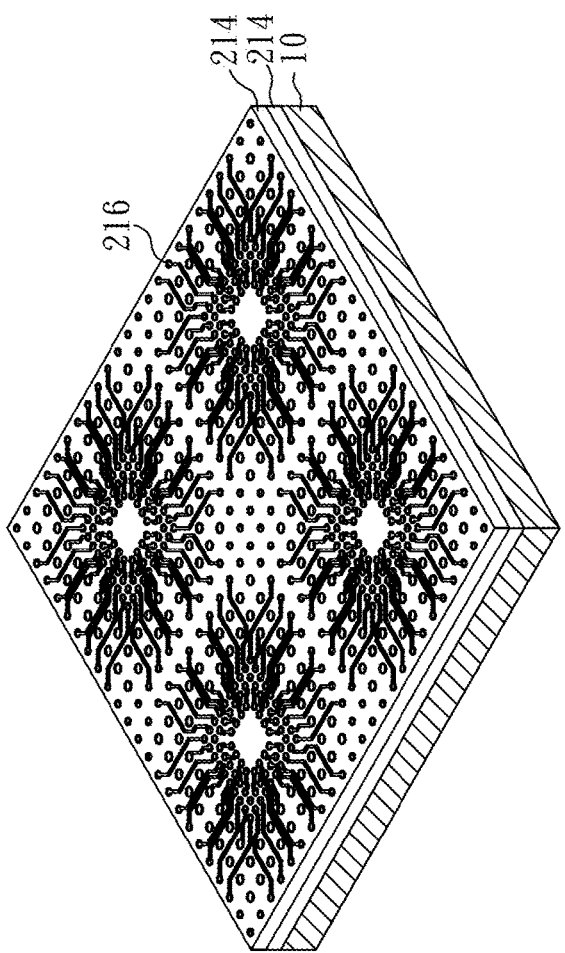

FIGS. 3 and 4 are cross-sectional and top perspective views, respectively, of the structure with multiple dielectric layers 214 and multiple conductive trace layers 216 serially formed in an alternate fashion. The dielectric layers 214 are deposited typically by lamination or coating, and can be made of epoxy resin, glass-epoxy, polyimide, or the like. The conductive trace layers 216 extend laterally on the dielectric layers 214 and include metallized vias 218 in the dielectric layers 214. As a result, the conductive trace layers 216 can be electrically coupled to each other through the metallized vias 218. Likewise, the innermost conductive trace layer 216 can be electrically coupled to the routing layer 211 through the metallized vias 218.

Each of the conductive trace layers 216 can be deposited as a single layer or multiple layers by any of numerous techniques, such as electroplating, electroless plating, evaporating, sputtering, or their combinations. For instance, the conductive trace layer 216 can be deposited by first dipping the structure in an activator solution to render the dielectric layer 214 catalytic to electroless copper, and then a thin copper layer is electrolessly plated to serve as the seeding layer before a second copper layer is electroplated on the seeding layer to a desirable thickness. Alternatively, the seeding layer can be formed by sputtering a thin film such as titanium/copper before depositing the electroplated copper layer on the seeding layer. Once the desired thickness is achieved, the plated layer can be patterned to form the conductive trace layer 216 by any of numerous techniques including wet etching, electro-chemical etching, laser-assist etching, and their combinations, with an etch mask (not shown thereon that defines the conductive trace layer 216.

At this stage, the formation of a first routing circuitry 21 on the sacrificial carrier 10 is accomplished. In this illustration, the first routing circuitry 21 includes the routing layer 211, the dielectric layers 214 and the conductive trace layers 216.

Figure 5:
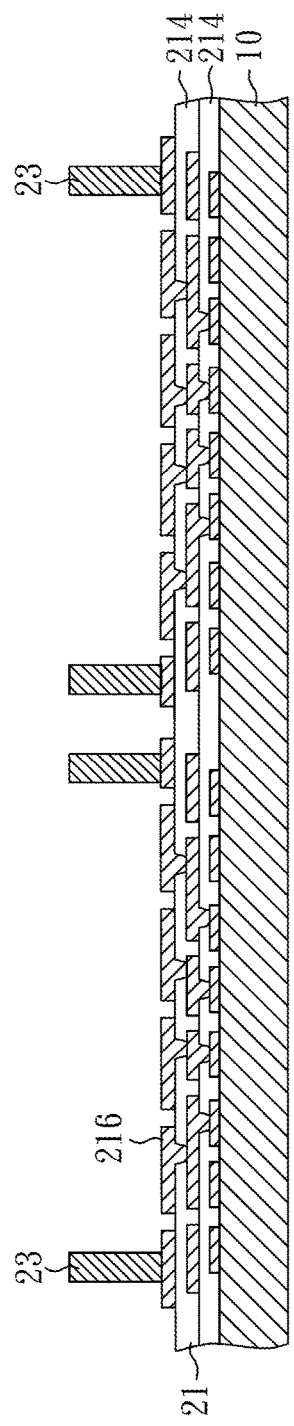
FIG. 5 is a cross-sectional view of the structure of FIG. 3 further provided with vertical connecting elements in accordance with the first embodiment of the present invention.

FIG. 5 is a cross-sectional view of the structure with an array of vertical connecting elements 23 on the first routing circuitry 21. In this illustration, the vertical connecting elements 23 are illustrated as metal pillars and electrically connected to and contact the outmost conductive trace layer 216 of the first routing circuitry 21.

Figure 6:
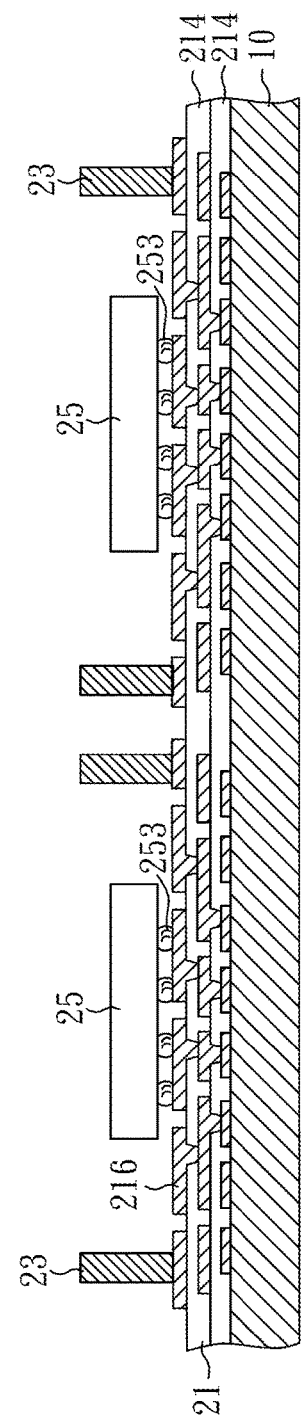
FIG. 6 is a cross-sectional view of the structure of FIG. 5 further provided with semiconductor devices in accordance with the first embodiment of the present invention.

FIG. 6 is a cross-sectional view of the structure with first semiconductor devices 25 electrically coupled to the first routing circuitry 21. The first semiconductor devices 25, illustrated as bare chips, can be electrically coupled to the outmost conductive trace layer 216 of the first routing circuitry 21 using bumps 253 by thermal compression, solder reflow or thermosonic bonding.

Figure 7:
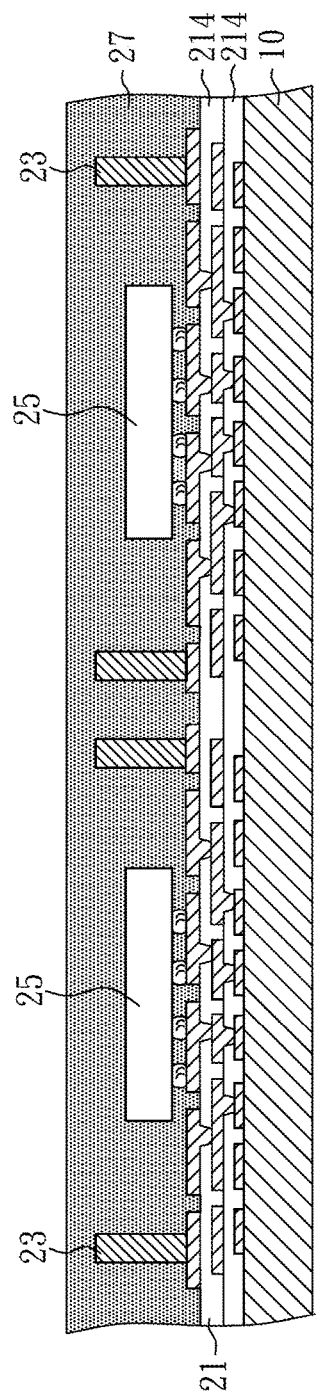
FIG. 7 is a cross-sectional view of the structure of FIG. 6 further provided with an encapsulant in accordance with the first embodiment of the present invention.

FIG. 7 is a cross-sectional view of the structure with an encapsulant 27 on the vertical connecting elements 23, the first semiconductor devices 25 and the first routing circuitry 21 by, for example, resin-glass lamination, resin-glass coating or molding. The encapsulant 27 covers the vertical connecting elements 23, the first semiconductor devices 25 and the first routing circuitry 21 from above and surrounds and conformally coats and covers sidewalls of the vertical connecting elements 23 and the first semiconductor devices 25.

Figure 8:
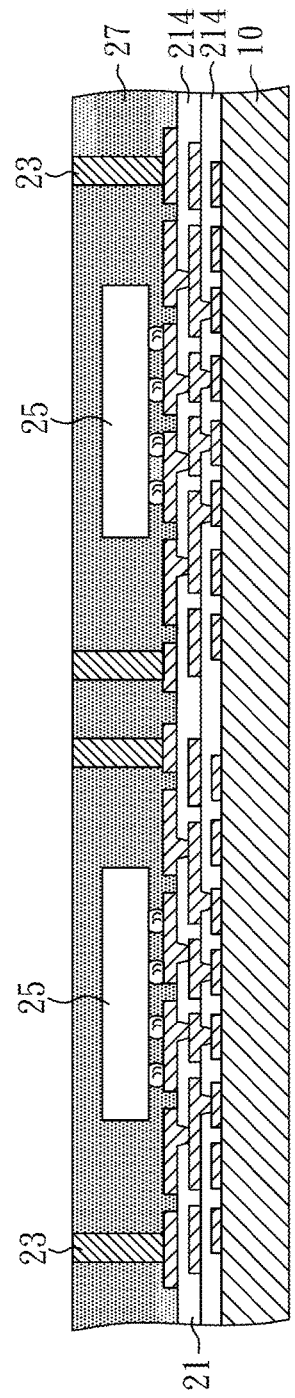
FIG. 8 is a cross-sectional view of the structure of FIG. 7 after removal of a top portion of the encapsulant in accordance with the first embodiment of the present invention.

FIG. 8 is a cross-sectional view of the structure with the vertical connecting elements 23 exposed from above. The upper portion of the encapsulant 27 can be removed by grinding. In this illustration, the vertical connecting elements 23 has an exposed surface substantially coplanar with an exterior surface of the encapsulant 27 from above.

Figure 9:
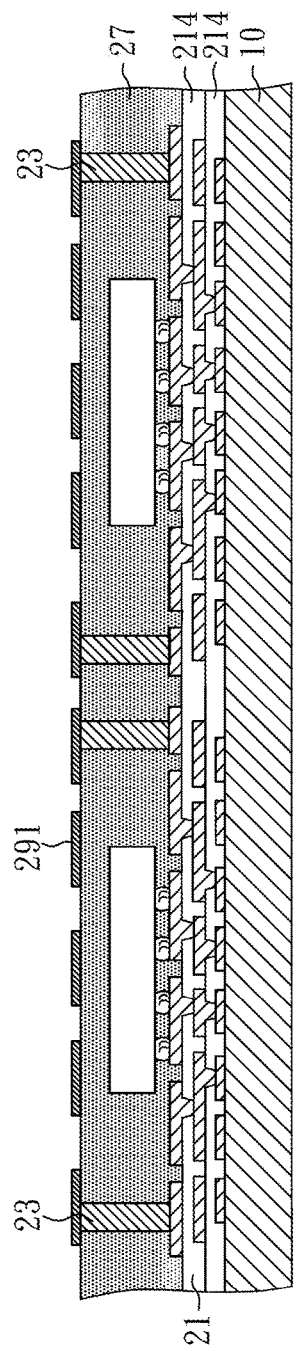
FIG. 9 is a cross-sectional view of the structure of FIG. 8 further provided with a routing layer in accordance with the first embodiment of the present invention.

FIG. 9 is a cross-sectional view of the structure provided with a routing layer 291 on the encapsulant 27 and electrically coupled to the vertical connecting elements 23 by metal pattern deposition described below. The top surface of the structure can be metallized to form an electrically conductive layer (typically a copper layer) as a single layer or multiple layers by numerous techniques, such as electroplating, electroless plating, evaporating, sputtering or their combinations. The electrically conductive layer can be made of Cu, Ni, Ti, Au, Ag, Al, their combinations, or other suitable electrically conductive material. Typically, a seeding layer is formed on the topmost surface of the structure prior to the electrically conductive layer is electroplated to a desirable thickness. The seeding layer may consist of a diffusion barrier layer and a plating bus layer. The diffusion barrier layer is to counterbalance oxidation or corrosion of the electrically conductive layer such as copper. In most cases, the diffusion barrier layer also acts as an adhesion promotion layer to the underlying material and is formed by physical vapor deposition (PVD) such as sputtered Ti or TiW with a thickness in a range from about 0.01 µm to about 0.1 µm. However, the diffusion barrier layer may be made of other materials, such as TaN, or other applicable materials and its thickness range is not limited to the range described above. The plating bus layer is typically made of the same material as the electrically conductive layer with a thickness in a range from about 0.1 µm to about 1 µm. For example, if the electrically conductive layer is copper, the plating bus layer would preferably be a thin film copper formed by physical vapor deposition or electroless plating. However, the plating bus layer may be made of other applicable materials such as silver, gold, chromium, nickel, tungsten, or combinations thereof and its thickness range is not limited to the range described above.

Following the deposition of the seeding layer, a photoresist layer (not shown) is formed over the seeding layer. The photoresist layer may be formed by a wet process, such as a spin-on process, or by a dry process, such as lamination of a dry film. After the photoresist layer is formed, the photoresist layer is patterned to form openings, which are then filled with plated metal such as copper to form the routing layer 291. After metal plating, the exposed seeding layer is then removed by etching process to form electrically isolated conductive traces as desired.

Figure 10:
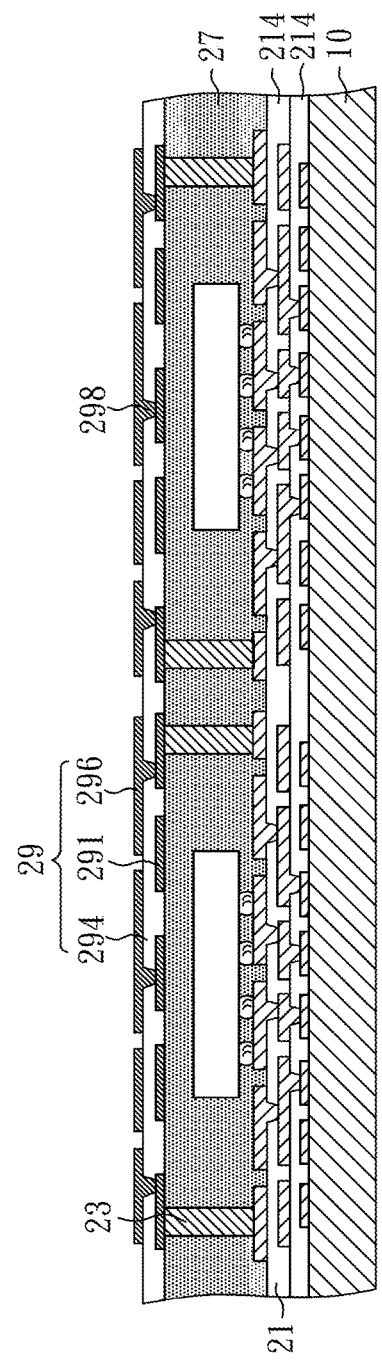
FIG. 10 is a cross-sectional view of the structure of FIG. 9 further provided with a dielectric layer and a conductive trace layer to finish the formation of a second routing circuitry on the encapsulant in accordance with the first embodiment of the present invention.

FIG. 10 is a cross-sectional view of the structure with a dielectric layer 294 and a conductive trace layer 296 serially formed in an alternate fashion. The dielectric layer 294 contacts and covers and extends laterally on the encapsulant 27 and the routing layer 291 from above. The conductive trace layer 296 extends laterally on the dielectric layer 294 and includes metallized vias 298 in the dielectric layer 294. As a result, the conductive trace layer 296 can be electrically coupled to the routing layer 291 through the metallized vias 298.

At this stage, a second routing circuitry 29 is accomplished and electrically connected to the first routing circuitry 21 through the vertical connecting elements 23. In this illustration, the second routing circuitry 29 includes the routing layer 291, the dielectric layer 294 and the conductive trace layer 296.

FIG. 11 is a cross-sectional view of the structure after removal of the sacrificial carrier 10. The sacrificial carrier 10 can be removed to expose the first routing circuitry 21 from below by numerous techniques including wet chemical etching using acidic solution (e.g., ferric chloride, copper sulfate solutions), or alkaline solution (e.g., ammonia solution), electro-chemical etching, or mechanical process such as a drill or end mill followed by chemical etching. In this embodiment, the sacrificial carrier 10 made of an iron-based material is removed by a chemical etching solution that is selective between copper and iron so as to prevent the copper routing layer 211 from being etched during removal of the sacrificial carrier 10.

FIG. 12 is a cross-sectional view of the panel-scale structure of FIG. 11 diced into individual pieces. In this illustration, the panel-scale structure is singulated into individual electronic component 20 along dicing lines "L".

FIG. 13 is a cross-sectional view of the individual electronic component 20 that includes the first routing circuitry 21, the vertical connecting elements 23, the semiconductor device 25, the encapsulant 27 and the second routing circuitry 29. In this illustration, the first routing circuitry 21 and the second routing circuitry 29 are multi-layered buildup circuitries at two opposite sides of the encapsulant 27 and electrically connected to each other through the vertical connecting elements 23. The first routing circuitry 21 is located at the first surface 271 of the encapsulant 27, whereas the second routing circuitry 29 is located at the second surface 272 of the encapsulant 27. The semiconductor device 25 is embedded in the encapsulant 27 and electrically coupled to the first routing circuitry 21. The vertical connecting elements 23 are sealed in the encapsulant 27 and surround the semiconductor device 25 and extend from the first routing circuitry 21 to the second surface 272 of the encapsulant 27. The second routing circuitry 29 is electrically coupled to the vertical connecting elements 23 and thus is electrically connected to the first routing circuitry 21 through the vertical connecting elements 23.

Figure 14:
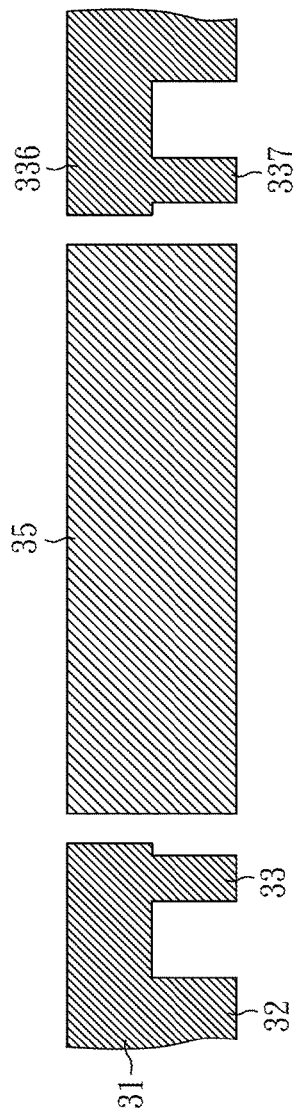
FIGS. 14 and 15 are cross-sectional and top perspective views, respectively, of a textured metal sheet in accordance with the first embodiment of the present invention.
Figure 15:
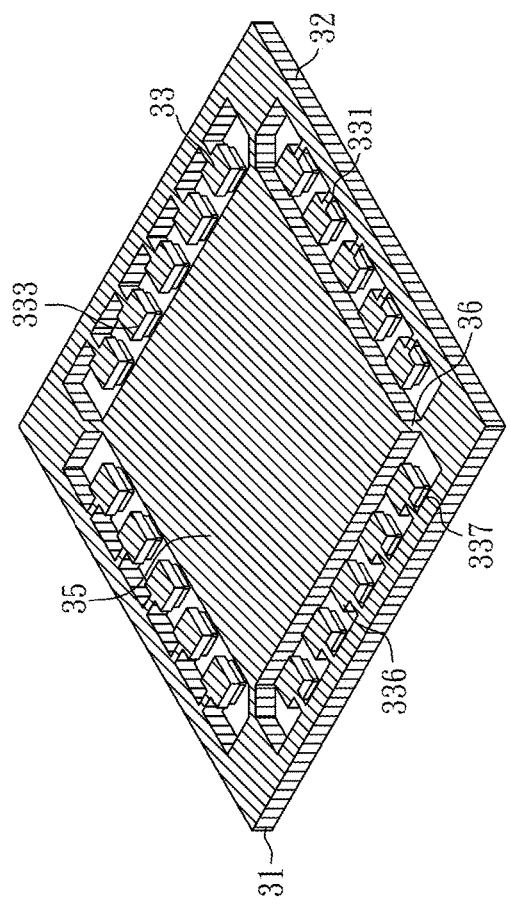

FIGS. 14 and 15 are cross-sectional and top perspective views, respectively, of a textured metal sheet 31. The textured metal sheet 31 typically is made of copper alloys, steel or alloy 42, and can be formed by a wet etching or stamping/punching process from a rolled metal strip having a thickness in a range from about 0.15 mm to about 1.0 mm. The etching process may be a one-sided or two-sided etching to etch through the metal strip and thereby transfer the metal strip into a desired overall pattern of the textured metal sheet 31 that includes a metal frame 32, a plurality of metal leads 33, a metal slug 35 and a plurality of tie bars 36. The metal leads 33 laterally extend from the metal frame 32 toward the central area within the metal frame 32. As a result, the metal leads 33 each have an outer end 331 integrally connected to interior sidewalls of the metal frame 32 and an inner end 333 directed inwardly away from the metal frame 32. The metal slug 35 is located at the central area within the metal frame 32 and connected to the metal frame 32 by the tie bars 36. Additionally, in this embodiment, the textured metal sheet 31 is further selectively, half-etched from its bottom side. Accordingly, the metal leads 33 have stepped peripheral edges. The metal leads 33 each have a horizontally elongated portion 336 and a vertically projected portion 337. The vertically projected portion 337 protrudes from a lower surface of the horizontally elongated portion 336 in the downward direction.

Figure 16:
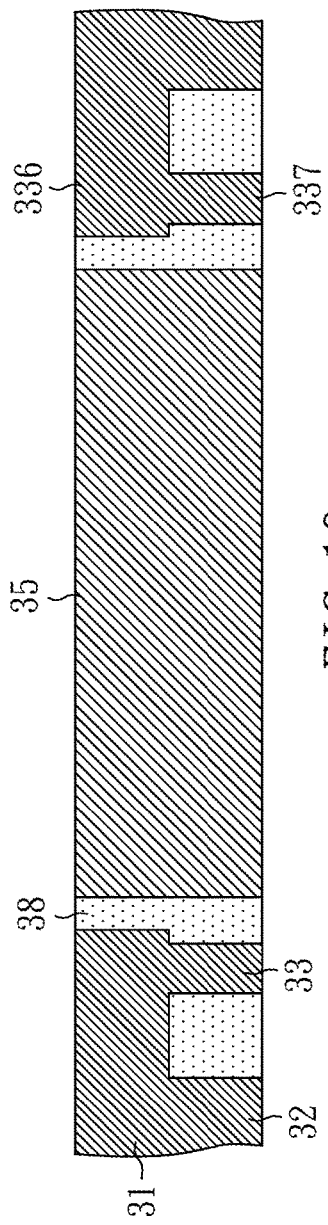
FIGS. 16 and 17 are cross-sectional and top perspective views, respectively, of the structure of FIGS. 14 and 15 further provided with a binding resin in accordance with the first embodiment of the present invention.
Figure 17:
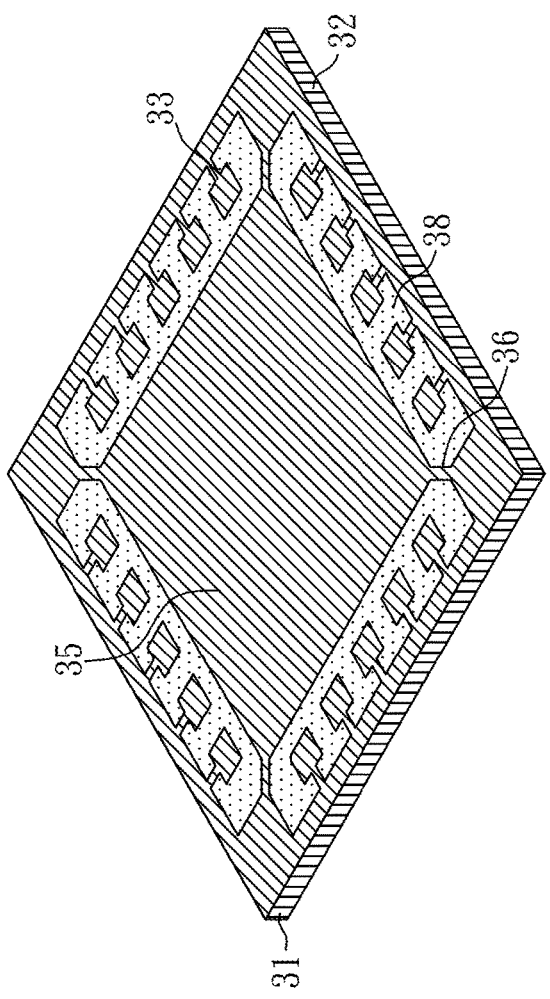

FIGS. 16 and 17 are cross-sectional and top perspective views, respectively, of the structure provided with a binding resin 38. The binding resin 38 can be deposited by applying a resin material into the remaining spaces within the metal frame 32 to fill in spaces between the metal leads 33 and between the metal slug 35 and the metal leads 33. The resin material can be applied by paste printing, compressive molding, transfer molding, liquid injection molding, spin coating, or other suitable methods. Then, a thermal process (or heat-hardened process) is applied to harden the resin material and to transform it into a solid molding compound. As a result, the binding resin 38 covers the lower surfaces of the horizontally elongated portions 336 as well as sidewalls of the vertically projected portions 337 and sidewalls of the metal slug 35. By the stepped cross-section profile of the metal leads 33, the binding resin 38 can securely interlock with the metal leads 33 so as to prevent the metal leads 33 from being vertically forced apart from the binding resin 38 and also to avoid micro-cracking at the interface along the vertical direction. In this illustration, the top surface of the binding resin 38 is substantially coplanar with the top sides of the metal leads 33 and the metal sing 35, whereas the bottom surface of the binding, resin 38 is substantially coplanar with the bottom sides of the metal leads 33 and the metal slug 35 by planarization.

The binding resin 38 typically includes binder resins, fillers, hardeners, diluents, and additives. There is no particular limit to the binder resin that can be used in accordance with the present invention. For example, the binder resin may be at least one selected from the group consisting of an epoxy resin, a phenol resin, a polyimide resin, a polyurethane resin, a silicone resin, a polyester resin, an acrylate, bismaleimide (BMI), and equivalents thereof. The binder resin provides intimate adhesion between an adherent and the filler. The binder resin also serves to elicit thermal conductivity through chain-like connection of the filler. The binder resin may also improve physical and chemical stability of the molding compound.

Additionally, there is no particular limit to the filler that can be used in accordance with the present invention. For example, a thermally conductive filler may be selected from the group consisting of aluminum oxide, aluminum nitride, silicon carbide, tungsten carbide, boron carbide, silica and equivalents thereof. More specifically, the binding resin 38 may become thermally conductive or have low CTE if suitable fillers are dispersed therein. For example, aluminum nitride (AlN) or silicon carbide (SiC) has relatively high thermal conductivity, high electrical resistance, and a relatively low coefficient of thermal expansion (CTE). Accordingly, when the binding resin 38 employs these kinds of materials as fillers, the binding resin 38 would exhibit improved heat dissipation performance, electrical isolation performance and show inhibition of delamination or cracking of circuitry or interfaces due to low CTE. The maximum particle size of the thermally conductive filler may be 25 µm or less. The content of the filler may be in the range of 10 to 90% by weight. If the content of the thermally conductive filler is less than 10% by weight, this may result in insufficient thermal conductivity and excessively low viscosity. Low viscosity means that it may be difficult to handle and control the process due to excessively easy outflow of the resin from the tool during dispensing or molding process. On the other hand, if the content of the filler is higher than 90% by weight, this may result in decreased adhesive strength and excessively high viscosity of the molding material. High viscosity of the molding material results in poor workability due to no outflow of the material from the tool during the dispensing or molding process. Additionally, the binding resin 38 may include more than one type of fillers. For example, the second filler may be polytetrafluoroethylene (PTFE) so as to further improve electrical isolation property of the binding resin 38. In any case, the binding resin 38 preferably has an elastic modulus larger than 1.0 GPa and a linear coefficient of thermal expansion in a range from about $5 \times 10^{-6}$ K$^{-1}$ to about $15 \times 10^{-6}$ K$^{-1}$.

FIGS. 18 and 19 are cress-sectional and top perspective views, respectively, of the structure after removal of the metal slug 35. The metal slug 35 can be entirely removed by numerous techniques, such as wet chemical etching, electro-chemical etching or laser, to form a through opening 305 that extends from the top surface to the bottom surface of the binding resin 38. At this stage, an untrimmed leadframe 30 is accomplished and includes the metal frame 32, the metal leads 33, the tie bars 36 and the binding resin 38.

Figure 20:
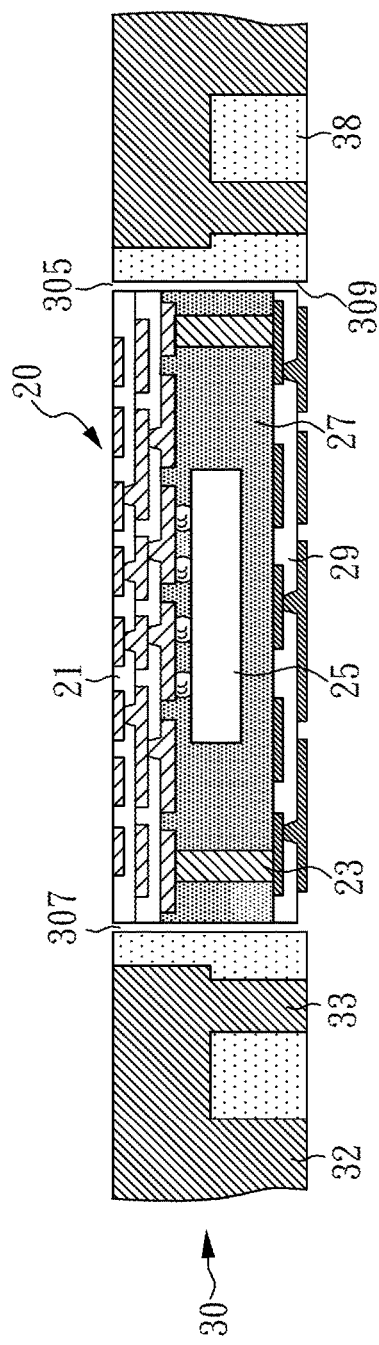
FIG. 20 is a cross-sectional view of the structure of FIG. 18 further provided with the electronic component of FIG. 13 in accordance with the first embodiment of the present invention.

FIG. 20 is a cross-sectional view of the structure with the electronic component 20 inserted into the through opening 305 of the leadframe 30. In this illustration, the interior sidewall surface 309 of the binding resin 38 is adjacent to and spaced from the peripheral edges of the electronic component 20. As a result, a space 307 is located in the through opening 305 between the electronic component 20 and the leadframe 30. The space 307 is laterally surrounded by the leadframe 30, and laterally surrounds the electronic component 20.

Figure 21:
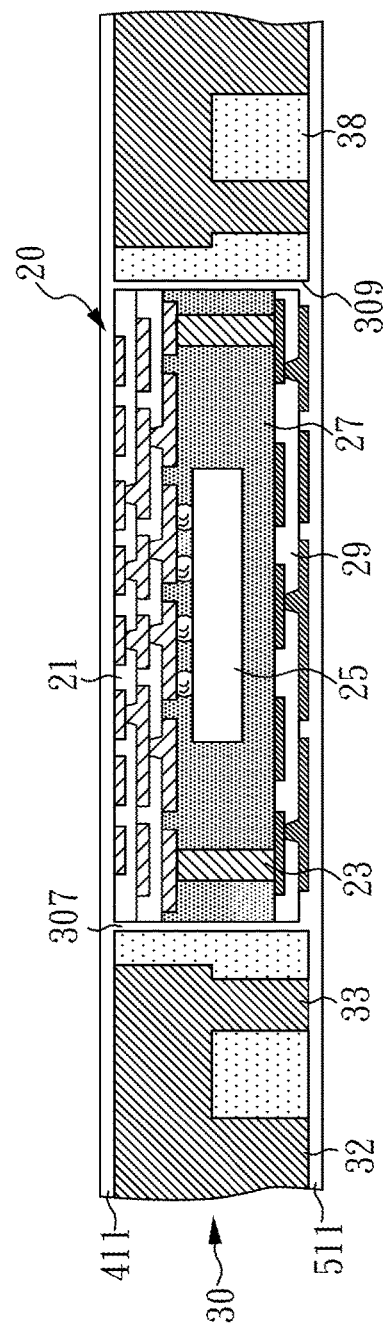
FIG. 21 is a cross-sectional view of the structure of FIG. 20 further provided with a first dielectric layer and a second dielectric layer in accordance with the first embodiment of the present invention.

FIG. 21 is a cross-sectional view of the structure with a first dielectric layer 411 and a second dielectric layer 511 laminated or coated on the electronic component 20 and the leadframe 30 from above and below, respectively. The first dielectric layer 411 covers and contacts the first routing circuitry 21 and the leadframe 30 from above, whereas the second dielectric layer 511 covers and contacts the second routing circuitry 29 and the leadframe 30 from below. Additionally, the first dielectric layer 411 and the second dielectric layer 511 further extend into the space 307 between the electronic component 20 and the leadframe 30. As a result, the interior sidewall surface 309 of the binding resin 38 can be bonded to the peripheral edges of the electronic component 20 through the first dielectric layer 411 and the second dielectric layer 511. The first dielectric layer 411 and the second dielectric layer 511 can be made of epoxy resin, glass-epoxy, polyimide, or the like, and typically have a thickness of 50 microns.

Figure 22:
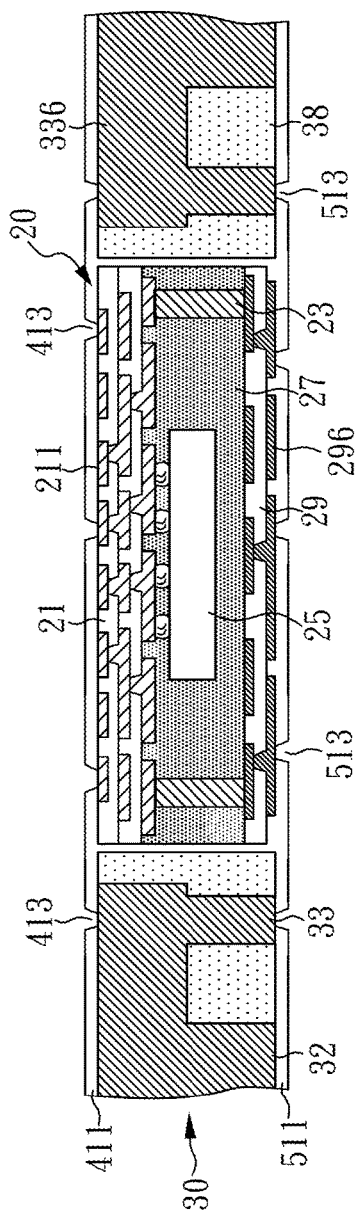
FIG. 22 is a cross-sectional view of the structure of FIG. 21 further provided with first via openings and second via openings in accordance with the first embodiment of the present invention.

FIG. 22 is a cross-sectional view of the structure provided with first via openings 413 in the first dielectric layer 411 and second via openings 513 in the second dielectric layer 511. The first via openings 413 extend through the first dielectric layer 411 and are aligned with the selected portions of the routing layer 211 of the first routing circuitry 21 and the metal leads 33. The second via openings 513 extend through the second dielectric layer 511 and are aligned with the selected portions of the conductive trace layer 296 of the second routing circuitry 29 and the metal leads 33. The first via openings 413 and the second via openings 513 can be formed by numerous techniques including laser drilling, plasma etching and photolithography, and typically have a diameter of 50 microns. Laser drilling can be enhanced by a pulsed laser. Alternatively, a scanning laser beam with a metal mask can be used.

Figure 23:
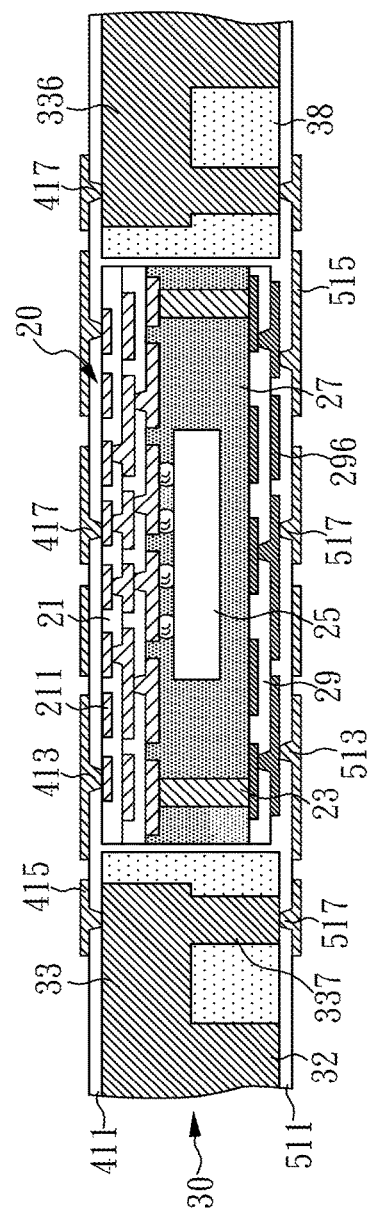
FIG. 23 is a cross-sectional view of the structure of FIG. 22 further provided with a first wiring layer and a second wiring layer in accordance with the first embodiment of the present invention.

Referring now to FIG. 23, a first wiring layer 415 and a second wiring layer 515 are respectively formed on the first dielectric layer 411 and the second dielectric layer 511 by metal deposition and metal patterning process. The first wiring layer 415 extends from the routing layer 211 of the first routing circuitry 21 and the horizontally elongated portions 336 of the metal leads 33 in the upward direction, fills up the first via openings 413 to form first metallized vias 417 in direct contact with the first routing circuitry 21 and the metal leads 33, and extends laterally on the first dielectric layer 411. The second wiring layer 515 extends from the conductive trace layer 296 of the second routing circuitry 29 and the vertically projected portions 337 of the metal leads 33 in the downward direction, fills up the second via openings 513 to form second metallized vias 517 in direct contact with the second routing circuitry 29 and the metal leads 33, and extends laterally on the second dielectric layer 511.

Figure 24:
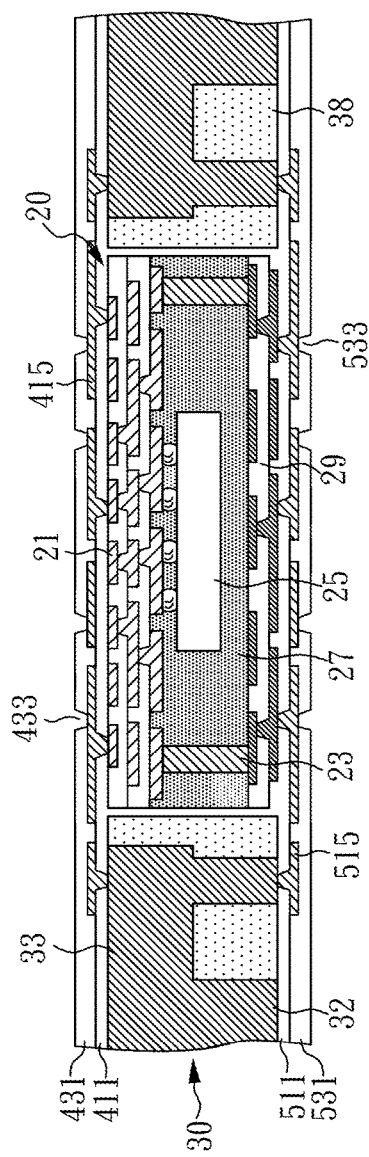
FIG. 24 is a cross-sectional view of the structure of FIG. 24 further provided with a third dielectric layer and a fourth dielectric layer as well as third via openings and fourth via openings in accordance with the first embodiment of the present invention.

FIG. 24 is a cross-sectional view of the structure with a third dielectric layer 431 and a fourth dielectric layer 531 respectively laminated or coated on the first dielectric layer 411/the first wiring layer 415 and the second dielectric layer 511/the second wiring layer 515 as well as third via openings 433 in the third dielectric layer 411 and fourth via openings 533 in the fourth dielectric layer 531. The third dielectric layer 431 contacts and covers the first dielectric layer 411/the first wiring layer 415. The fourth layer 531 contacts and covers the second dielectric layer 511/the second wiring layer 515. The third dielectric layer 431 and the fourth dielectric layer be formed of epoxy resin, glass-epoxy, polyimide or the like, and typically has a thickness of 50 microns. After the deposition of the third dielectric layer 431 and the fourth dielectric layer 531, the third via openings 433 and the fourth via openings 533 are formed to expose selected portions of the first wiring layer 415 and the second wiring layer 515 from above and below, respectively. The third via openings 433 extend through the third dielectric layer 431 and are aligned with selected portions of the first wiring layer 415. The fourth via openings 533 extend through the fourth dielectric layer 531 and are aligned with selected portions of the second wiring layer 515. Like the first via openings 413 and the second via openings 513, the third via openings 433 and the fourth via openings 533 can be formed by any of numerous techniques, such as laser drilling, plasma etching and photolithography and typically have a diameter of 50 microns.

Figure 25:
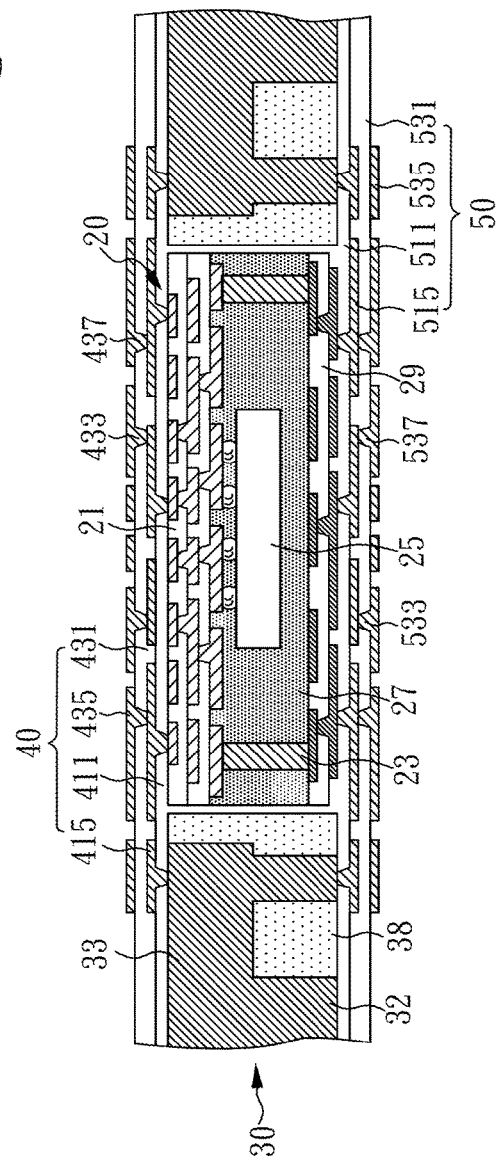
FIG. 25 is a cross-sectional view of the structure of FIG. 24 further provided with a third wiring layer and a fourth wiring layer to finish the fabrication of an untrimmed wiring board in accordance with the first embodiment of the present invention.

FIG. 25 is a cross-sectional view of the structure provided with a third wiring layer 435 on the third dielectric layer 431 and a fourth wiring layer 535 on the fourth dielectric layer 531 by metal deposition and metal patterning process. The third wiring layer 435 extends from the first wiring layer 415 in the upward direction, fills up the third via openings 433 to form third metallized vias 437 in direct contact with the first wiring layer 415, and extends laterally on the third dielectric layer 431. The fourth wiring layer 535 extends from the second wiring layer 515 in the downward direction, fills up the fourth via openings 533 to form fourth metallized vias 537 in direct contact with the second wiring layer 515, and extends laterally on the fourth dielectric layer 531. As a result, a first buildup circuitry 40 and a second buildup circuitry 50 are formed an two opposite sides of the electronic component 20 and the leadframe 30, respectively. In this illustration, the first buildup circuitry 40 includes the first dielectric layer 411, the first wiring layer 415, the third dielectric layer 431 and the third wiring layer 435, whereas the second buildup circuitry 50 includes the second dielectric layer 511, the second wiring layer 515, the fourth dielectric layer 531 and the fourth wiring layer 535. At this stage, an untrimmed wiring board 100 is accomplished and includes the electronic component 20, the leadframe 30, the first buildup circuitry 40 and the second buildup circuitry 50.

Figure 26:
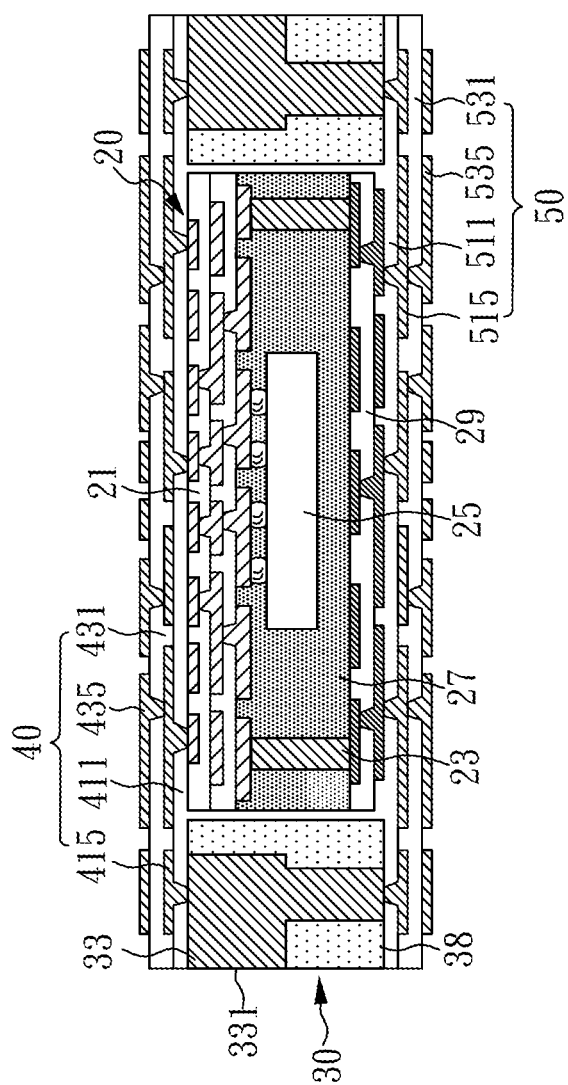
FIG. 26 is a cross-sectional view of the wiring board trimmed from the structure of FIG. 25 in accordance with the first embodiment of the present invention.

FIG. 26 is a cross-sectional view of the trimmed wiring board 100 after removal of the metal frame 32 as well as portions of the first buildup circuitry 40 and the second buildup circuitry 50. After separating the metal frame 32 from the metal leads 33, the outer ends 331 of the metal leads 33 are situated at peripheral edges of the trimmed wiring board 100 and have a lateral surface flush with peripheral edges of the binding resin 38.

Figure 27:
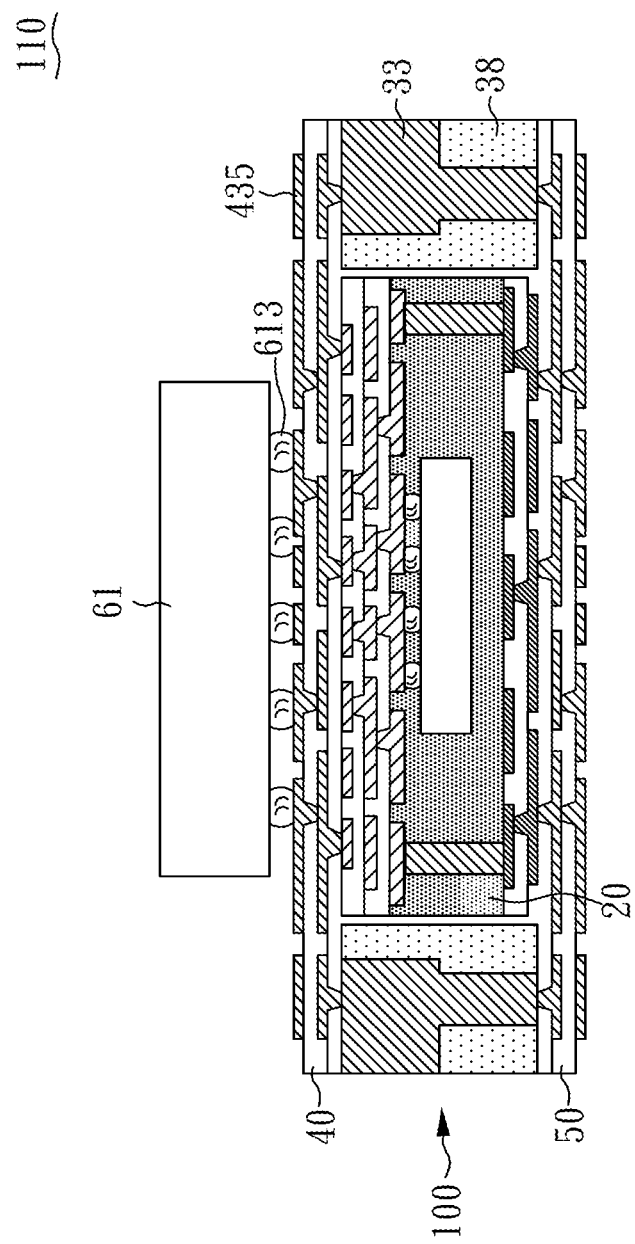
FIG. 27 is a cross-sectional view of the structure of FIG. 26 further provided with a top semiconductor device in accordance with the first embodiment of the present invention.

FIG. 27 is a cross-sectional view of a semiconductor assembly 110 with a top semiconductor device 61 electrically coupled to the wiring hoard 100 of FIG. 26. The top semiconductor device 61, illustrated as a chip, is mounted on the first buildup circuitry 40 and electrically coupled to the third wiring layer 435 through conductive bumps 613.

Figure 28:
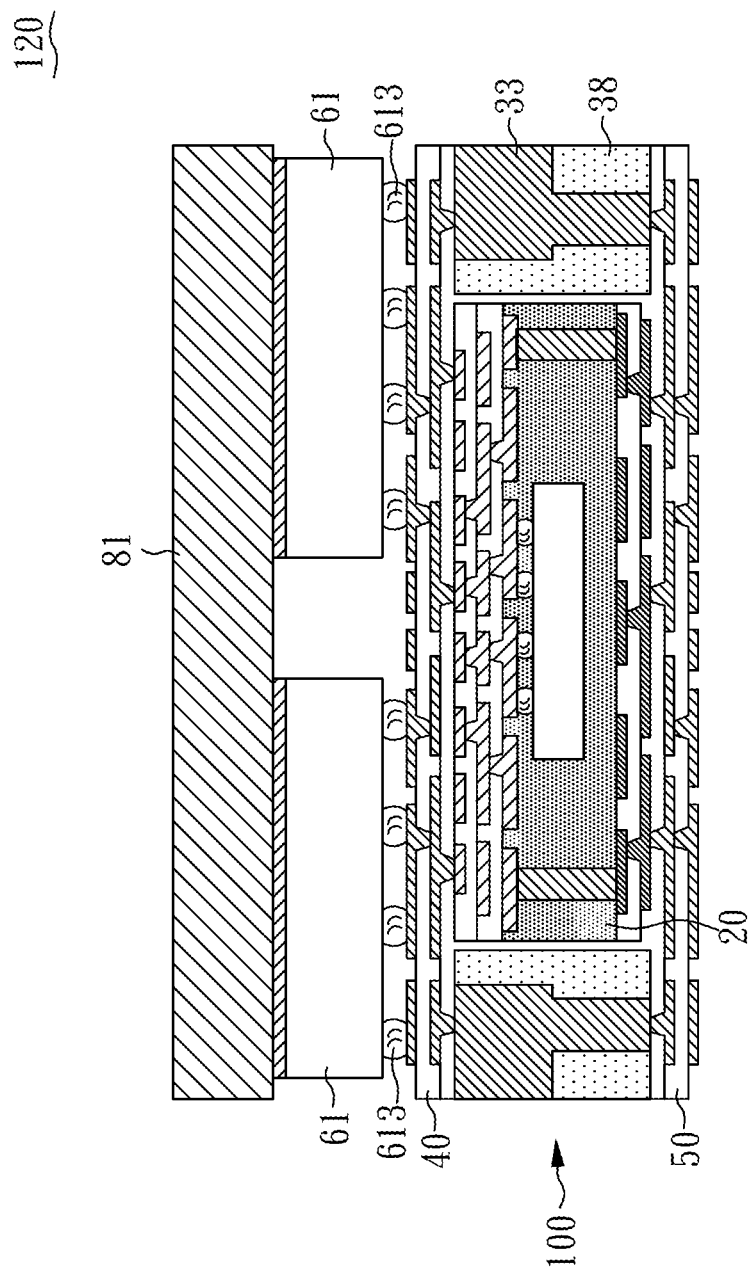
FIG. 28 is a cross-sectional view of the structure of FIG. 26 further provided with top semiconductor devices and a heat spreader in accordance with the first embodiment of the present invention.

FIG. 28 is a cross-sectional view of another semiconductor assembly 120 with top semiconductor devices 61 electrically coupled to the wiring board 100 of FIG. 26 and thermally conductible to a heat spreader 811. The top semiconductor devices 61 are mounted on the first buildup circuitry 40 through conductive bumps 613. The heat spreader 81 can be made of any material with high thermal conductivity, such as metal, alloy, silicon, ceramic or graphite, and is attached on the semiconductor devices 61 for heat dissipation.

Figure 29:
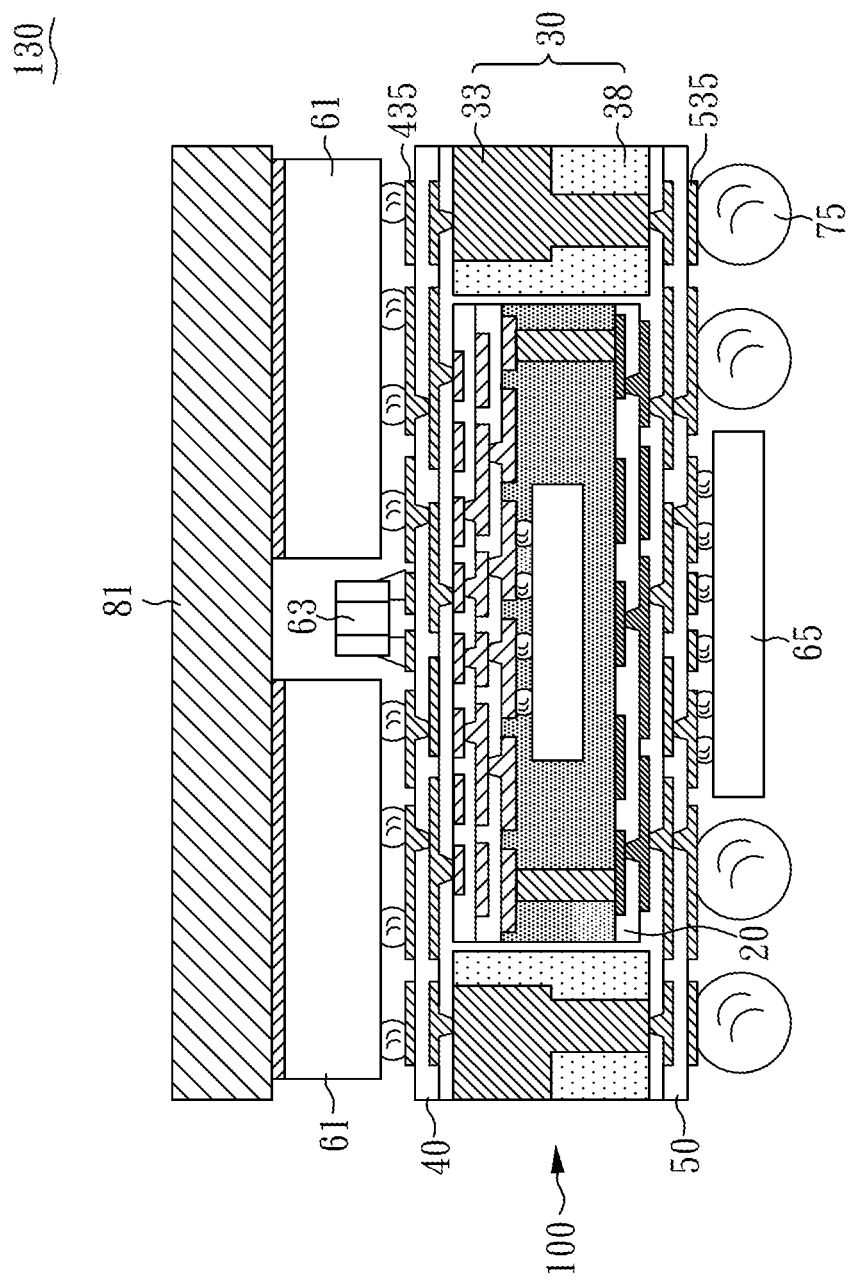
FIG. 29 is a cross-sectional view of the structure of FIG. 26 further provided with top semiconductor devices, a passive component, a heat spreader, a bottom semiconductor device and solder balls in accordance with the first embodiment of the present invention.

FIG. 29 is a cross-sectional view of yet another semiconductor assembly 130 with top semiconductor devices 61, a passive component 63, a bottom semiconductor device 65 and solder balls 75 electrically coupled to the wiring hoard 100 of FIG. 26. The top semiconductor devices 61 are electrically coupled to the first buildup circuitry 40, whereas the bottom semiconductor device 65 are electrically coupled to the second buildup circuitry 50. As a result, the top semiconductor devices 61 and the bottom semiconductor device 65 can be electrically connected to each other through the electronic component 20, the leadframe 30, the first buildup circuitry 40 and the second buildup circuitry 50. For thermal dissipation, a heat spreader 81 is further attached on the top semiconductor devices 61. Additionally, the passive component 63 is mounted on the third wiring layer 435 of the first buildup circuitry 40 for improved electrical performance, and the solder balls 75 are mounted on the fourth wiring layer 535 of the second buildup circuitry 50 for next-level connection.

[Embodiment 2]

Figure 30:
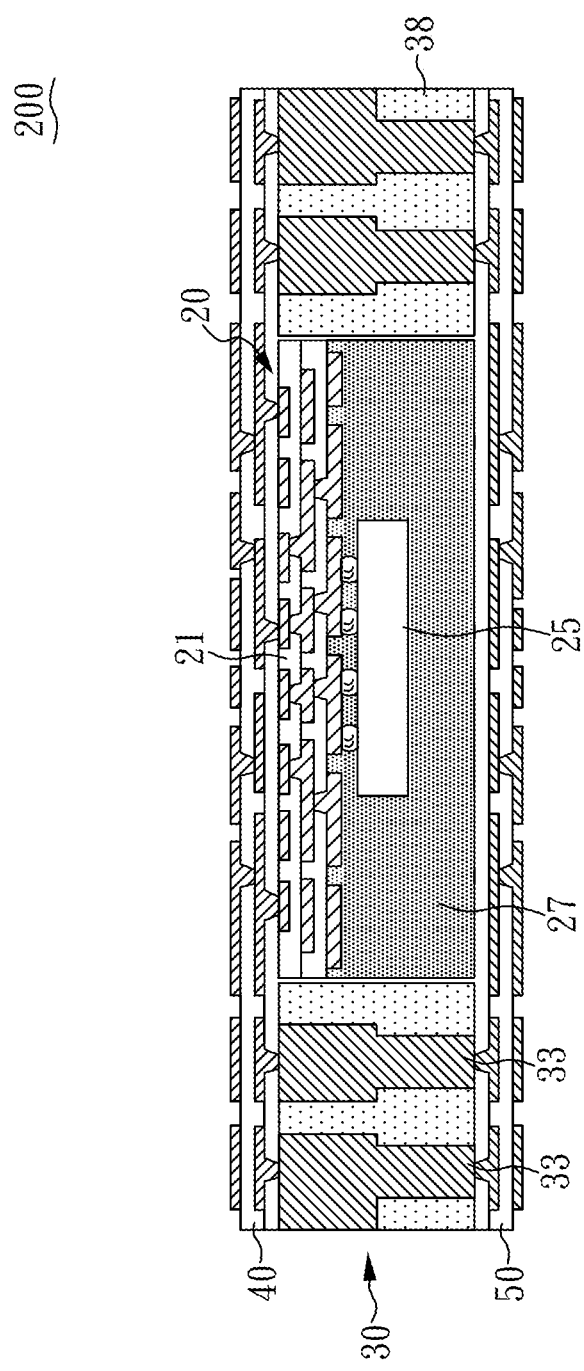
FIG. 30 is a cross-sectional view of a wiring board in accordance with the second embodiment of the present invention.

FIG. 30 is a cross-sectional view of another wiring board in accordance with the second embodiment of the present invention.

For purposes of brevity, any description in Embodiment 1 is incorporated herein insofar as the same is applicable, and the same description need not be repeated.

In this wiring board 200, the electronic component 20 is similar to that illustrated in FIG. 13, except that no vertical connecting elements are sealed in the encapsulant 27 and no second routing circuitry is electrically coupled to the second buildup circuitry 50. As a result, the first buildup circuitry 40 and the second buildup circuitry 50 are electrically connected to each other through the metal leads 33 of the leadframe 30.

Figure 31:
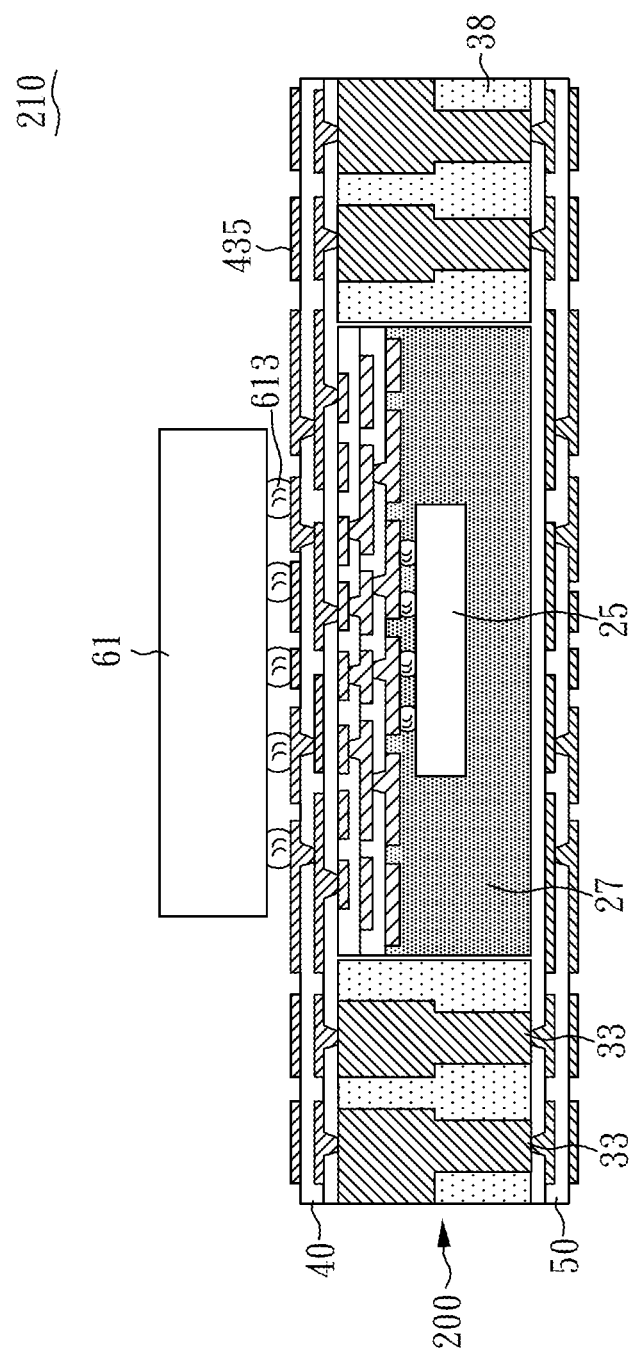
FIG. 31 is a cross-sectional view of the structure of FIG. 30 further provided with a top semiconductor device in accordance with the second embodiment of the present invention.

FIG. 31 is a cross-sectional view of a semiconductor assembly 210 with a top semiconductor device 61 electrically coupled to the wiring board 200 of FIG. 30. The top semiconductor device 61 is mounted on the first buildup circuitry 40 through conductive bumps 613 and thus is electrically connected to the embedded semiconductor device 25 in the encapsulant 27 through the first buildup circuitry 40 and the first muting circuitry 21.

[Embodiment 3]

Figure 32:
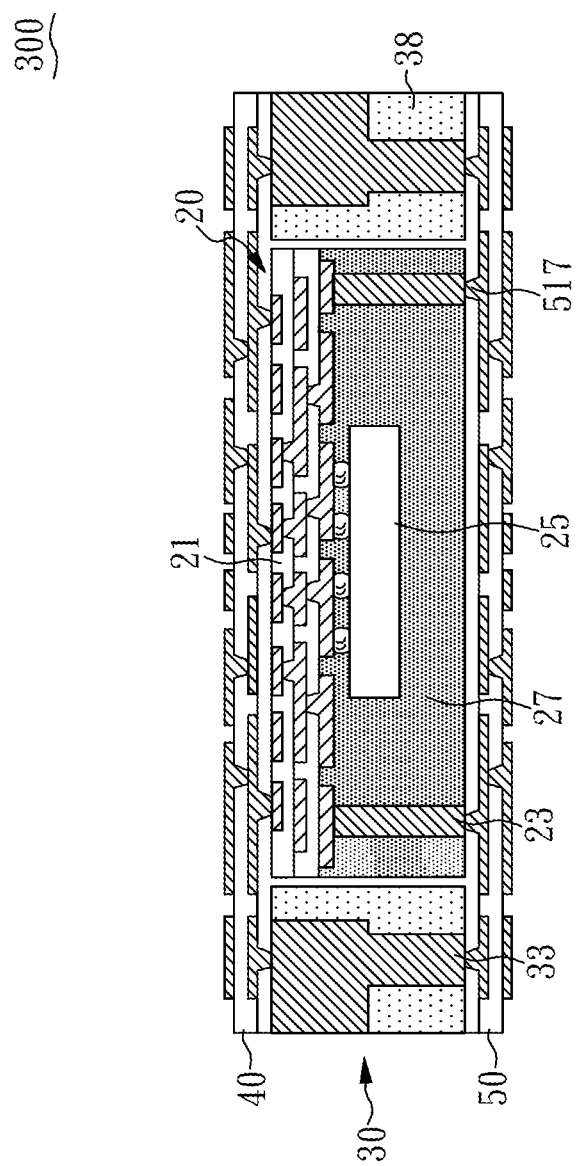
FIG. 32 is a cross-sectional view of a wiring board in accordance with the third embodiment of the present invention.

FIG. 32 is a cross-sectional view of yet another wiring board in accordance with the third embodiment of the present invention.

For purposes of brevity, any description in the Embodiments above is incorporated herein insofar as the same is applicable, and the same description need not be repeated.

In this wiring board 300, the electronic component 20 is similar to that illustrated in FIG. 13, except that no second routing circuitry is disposed between the encapsulant 27 and the second buildup circuitry 20. As a result, the second buildup circuitry 50 is directly electrically coupled to the vertical connecting elements 23 through the second metallized vias 517 in contact with the vertical connecting elements 23.

[Embodiment 4]

Figure 33:
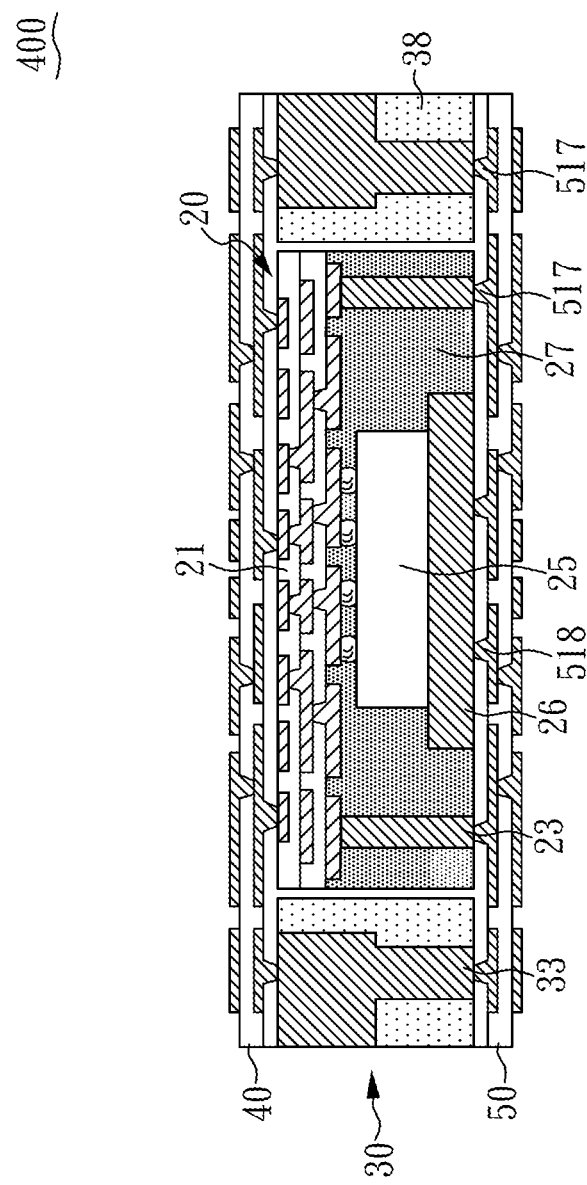
FIG. 33 is a cross-sectional view of a wiring board in accordance with the fourth embodiment of the present invention.

FIG. 33 is a cross-sectional view of a wiring board with a heat spreader attached to the semiconductor device in accordance with the fourth embodiment of the present invention.

For purposes of brevity, any description in the Embodiments above is incorporated herein insofar as the same is applicable, and the same description need not be repeated.

The wiring board 400 is similar to that illustrated in FIG. 32, except that the electronic component 20 further includes a heat spreader 26 attached on an inactive surface of the semiconductor device 25. The heat spreader 26 is thermally conductible to the second buildup circuitry 50 through additional second metallized vias 518 as heat pipes in contact with the heat spreader 26. As a result, the heat generated by the semiconductor device 25 can be conducted away through the heat spreader 26 and the second buildup circuitry 50.

The wiring board and assemblies described above are merely exemplary. Numerous other embodiments are contemplated. In addition, the embodiments described above can be mixed-and-matched with one another and with other embodiments depending on design and reliability considerations. For instance, the wiring board may include multiple electronic components arranged in an array. Also, the first buildup circuitry and the second buildup circuitry can include additional conductive traces to receive and route additional electronic component.

As illustrated in the aforementioned embodiments, a distinctive wiring board is configured to exhibit improved reliability, which includes an electronic component, a leadframe, a first buildup circuitry and a second buildup circuitry. In a preferred embodiment, the electronic component includes a first routing circuitry, a semiconductor device, an encapsulant, optionally vertical connecting elements, and optionally a second routing circuitry. The first routing circuitry and the optional second routing circuitry are disposed within a space surrounded by the leadframe, whereas the first buildup circuitry and the second buildup circuitry are disposed outside of the space surrounded by the leadframe and laterally extend over two opposite sides of the leadframe, respectively. For the convenience of below description, the direction in which the first surface of the encapsulant faces is defined as the first direction, and the direction in which the second surface of the encapsulant faces is defined as the second direction. The first routing circuitry is disposed adjacent to the first surface of the encapsulant, whereas the second routing circuitry is disposed adjacent to the second surface of the encapsulant.

The semiconductor device can be a packaged or unpackaged chip. For instance, the semiconductor device can be a bare chip, or a wafer level packaged die, etc. Alternatively, the semiconductor device can be a stacked-die chip. In a preferred embodiment, the semiconductor device is electrically coupled to the first routing circuitry detachably adhered over a sacrificial carrier and optionally is laterally surrounded by the vertical connecting elements, followed by providing the encapsulant over the first routing circuitry, optionally forming the second routing circuitry over the encapsulant, and then removing the sacrificial carrier to form an electronic component. In this case, the semiconductor device can be electrically coupled to the first routing circuitry using bumps with its active surface facing the first routing circuitry. Preferably, the electronic component is fabricated by a panel scale process followed by a singulation process. Further, before the step of providing the encapsulant, a heat spreader may be attached to the semiconductor device. As a result, the heat generated by the semiconductor device can be conducted away through the heat spreader.

The optional vertical connecting elements are laterally covered by the encapsulant and can have a thickness substantially equal to or less than that of the encapsulant to provide electrical contacts for next circuitry connection. In a preferred embodiment, the optional vertical connecting elements are located between the first routing circuitry and the second routing circuitry, and have two opposite ends electrically coupled to the first routing circuitry and the second routing circuitry, respectively. Alternatively, in another preferred embodiment, no second routing circuitry is formed on the second surface, of the encapsulant, and the vertical connecting elements are located between and electrically coupled to the first routing circuitry and the second buildup circuitry.

The first routing circuitry can be a multi-layered buildup circuitry without a core layer and include at least one dielectric layer and at least one conductive trace layer that includes metallized vias in the dielectric layer and extends laterally on the dielectric layer. The dielectric layer and the conductive trace layer are serially formed in an alternate fashion and can be in repetition when needed. For instance, the first routing circuitry may include a routing layer on the sacrificial carrier, a dielectric layer on the routing layer and the sacrificial carrier, and a conductive trace layer that extends from selected portions of the routing layer and extends through the dielectric layer to form metallized vias and laterally extends on the dielectric layer. Further, the first routing circuitry may include additional dielectric layers and additional conductive trace layers if needed for further signal routing. In the present invention, the step of forming the first routing circuitry on the sacrificial carrier can be executed by directly forming the first routing circuitry on the sacrificial carrier, or by separately forming and then detachably adhering the first routing circuitry to the sacrificial carrier. In a preferred embodiment, the first routing circuitry has a planar top surface substantially coplanar with the planar top side of the leadframe and in contact with the first buildup circuitry.

The optional second routing circuitry is disposed on the second surface of the encapsulant and can include a routing layer extending laterally on the second surface of the encapsulant and electrically coupled to the vertical connecting elements. Additionally, the second routing circuitry may be a multi-layered buildup circuitry without a core layer and further include at least one dielectric layer and at least one conductive trace layer that includes metallized vias in the dielectric layer and extends laterally on the dielectric layer. The dielectric layer and the conductive trace layer are serially formed in an alternate fashion and can be in repetition when needed. The innermost conductive layer, adjacent to the routing layer, of the second routing circuitry can be electrically coupled to the routing layer through metallized vias in contact with the routing layer, whereas the outmost conductive layer, adjacent to the second buildup circuitry, of the second routing circuitry can provide electrical contacts for next-level circuitry connection. As a result, the second routing circuitry can provide electrical connection between the vertical connecting elements and the second buildup circuitry.

The leadframe includes a plurality of metal leads and a binding resin, and is located around peripheral edges of the first routing circuitry, the encapsulant and the optional second routing circuitry. In a preferred embodiment, the leadframe is fabricated by steps of: providing a metal frame and metal leads, wherein the metal leads are integrally connected to the metal frame and each has an inner end directed inwardly away from the metal frame; and forming a binding resin that fills in remaining spaces within the metal frame. After forming the binding resin, the metal frame can be separated from the metal leads. As a result, the metal leads can have an exterior lateral surface flush with peripheral edges of the binding resin. Furthermore, a metal slug may be provided within the metal frame before provision of the binding resin. Accordingly, by removing the metal slug after forming the binding resin, a through opening can be formed in the leadframe. Specifically, the through opening of the leadframe is laterally surrounded by the binding resin and extends from the top surface of the being resin to the bottom surface of the binding resin. In a preferred embodiment, the interior sidewall surface of the through opening of the leadframe laterally surrounds and is spaced from and bonded to peripheral edges of the electronic component.

The metal leads can serve as horizontal and vertical signal transduction pathways or provide ground/power plane for power delivery and return. Each of the metal leads preferably is an integral one-piece lead, and has top and bottom sides not covered by the binding resin. In a preferred embodiment, the metal leads have a thickness in a range from about 0.15 mm to about 1.0 mm and laterally extend at least to a perimeter coincident with peripheral edges of the binding resin. For secure bonds between the metal leads and the binding resin, the metal leads may have stepped peripheral edges, interlocked with the binding resin. As a result, the binding resin also has a stepped cross-sectional profile where it contacts the metal leads so as to prevent the metal leads from being vertically forced apart from the binding resin and also to avoid micro-cracking at the interface along the vertical directions.

The binding resin can provide mechanical bonds between the metal leads, and may have a top surface substantially coplanar with the top sides of the metal leads and a bottom surface substantially coplanar with the bottom sides of the metal leads. When no second routing circuitry is provided in the electric component, the bottom surface of the binding resin and the bottom sides of the metal leads preferably are substantially coplanar with the second surface of the encapsulant. As an alternative, when the electronic component includes the second rowing circuitry on the second surface of the encapsulant, the bottom surface of the binding resin and the bottom sides of the metal leads preferably are substantially coplanar with an exterior surface of the second routing circuitry. In any case, the leadframe preferably has a planar bottom side substantially coplanar with the bottom surface of the electronic component. Further, the binding resin may have an elastic modulus larger than 1.0 GPa, a linear coefficient of thermal expansion in a range from about $5 \times 10^{-6}$ $K^{-1}$ to about $15 \times 10^{-6}$ $K^{-1}$. Additionally, for sufficient thermal conductivity and suitable viscosity, the binding resin may include thermally conductive fillers in a range of 10 to 90% by weight. For instance, the thermally conductive fillers may be made of aluminum nitride (AlN), aluminum oxide, silicon carbide (SiC), tungsten carbide, boron carbide, silica or the like and preferably has relatively high thermal conductivity, high electrical resistance, and a relatively low CTE. Accordingly, the binding resin would exhibit improved heat dissipation performance, electrical isolation performance and shows inhibition of delamination or cracking of the first buildup circuitry and the second buildup circuitry deposited thereon or interfaces due to low CTE. Additionally, the maximum particle size of the thermally conductive fillers may be 25 µm or less.

Each of the first buildup circuitry and the second buildup circuitry can include at least one dielectric layer and at least one wiring layer. The dielectric layer and the wiring layer are serially formed in an alternate fashion and can ben repetition when needed. The dielectric layers of the first buildup circuitry and the second buildup circuitry cover two opposite sides of the electronic component and the leadframe in the first direction and the second direction, respectively. Additionally, the dielectric layers of the first buildup circuitry and the second buildup circuitry may further extend into a space between the peripheral edges of the electronic component and the interior sidewall surface of the leadframe to provide mechanical bonds between the electronic component and the leadframe. The wiring layer extends through the dielectric layer to form metallized vias and extends laterally on the dielectric layer. Accordingly, the first buildup circuitry can be electrically coupled to the metal leads and the first routing circuitry through the metallized vias in contact with the first routing circuitry and the top sides of the metal leads. Likewise, the second buildup circuitry can be electrically coupled to the metal leads through the metallized vias in contact with the bottom sides of the metal leads. When the electronic component includes the vertical connecting elements, the second buildup circuitry is further electrically coupled to the vertical connecting elements through additional metallized vias in contact with the vertical connecting elements. Alternatively, when the electronic component includes the second routing circuitry in electrical connection with the vertical connecting elements, the second buildup circuitry can include additional metallized vias in contact with the second routing circuitry and thus be electrically connected to the vertical connecting elements through the second routing circuitry. The outmost wiring layers of the first buildup circuitry and the second buildup circuitry can accommodate conductive joints, such as bumps and solder balls, for electrical communication and mechanical attachment with for the next level assembly or another electronic device.

The term "cover" refers to incomplete or complete coverage in a vertical and/or lateral direction. For instance, in preferred embodiment, the second buildup circuitry covers the encapsulant regardless of whether additional elements such as the second routing circuitry is between the encapsulant and the second buildup circuitry.

The phrases "mounted on"and "attached on" include contact and non-contact with a single or multiple element(s). For instance, in a preferred embodiment, a heat spreader can be attached on the semiconductor device regardless of whether it contacts the semiconductor device or is separated from the semiconductor device by a thermally conductive adhesive.

The phrases "electrical connection", "electrically connected" and "electrically coupled" refer to direct and indirect electrical connection. For instance, in a preferred embodiment, the vertical connecting elements directly contact and are electrically connected to the first routing circuitry, whereas the second routing circuitry is spaced from and electrically connected to the first routing circuitry by the vertical connecting elements.

The "first direction" a "second direction" do not depend on the orientation of the wiring board, as will be readily apparent to those skilled in the art. For instance, the first surface of the encapsulant faces the first direction and the second surface of the encapsulant faces the second direction regardless of whether the wiring board is inverted. Thus, the first and second directions are opposite one another and orthogonal to the lateral directions. Furthermore, the first direction is the upward direction and the second direction is the downward direction when the exterior surface of the first buildup circuitry faces in the upward direction, and the first direction is the downward direction and the second direction is the upward direction when the exterior surface of the first buildup circuitry faces in the downward direction.

The wiring board according to the present invention has numerous advantages. For instance, the semiconductor device is electrically coupled to the first routing circuitry by a well-known flip chip bonding process such as thermocompression or solder reflow, which can avoid the positional accuracy issue inherent in most stackable approaches where an adhesive carrier is used for temporary bonding. The first routing circuitry provides the first level routing/interconnection for the semiconductor device, whereas the second routing circuitry on the encapsulant provides the second level routing, interconnection. The first buildup circuitry and the second buildup circuitry on two opposite sides of the electronic component and the leadframe provide the third level routing/interconnection and electrical contacts for next-level board assembling. The leadframe provides electrical connection between the first buildup circuitry and the second buildup circuitry, and offers an anti-warping platform for the dual buildup circuitry formation thereon to suppress warping and bending of the wiring board. The wiring board made by this method is reliable, inexpensive and well-suited for high volume manufacture.

The manufacturing process is highly versatile and permits a wide variety of mature electrical and mechanical connection technologies to be used in a unique and improved manner. The manufacturing process can also be performed without expensive tooling. As a result, the manufacturing process significantly enhances throughput, yield, performance and cost effectiveness compared to conventional techniques.

The embodiments described herein are exemplary and may simple or omit elements or steps well-known to those skilled in the art to prevent obscuring the present invention. Likewise, the drawings may omit duplicative or unnecessary dements and reference labels to improve clarity.

What is claimed is:

1. A wiring board, comprising:
an electronic component that includes a semiconductor device, a first routing circuitry and an encapsulant, wherein the semiconductor device is electrically coupled to the first routing circuitry and laterally covered by the encapsulant, and the encapsulant has a first surface facing in the first routing circuitry and a second surface opposite to the first surface;
a leadframe that laterally surrounds the electronic component and includes a plurality of metal leads and a binding resin, wherein the binding resin fills in spaces between the metal leads; a first buildup circuitry that is disposed over the first routing circuitry—and laterally extends over the leadframe, wherein the first buildup circuitry includes at least one dielectric layer and at least one wiring layer in an alternate fashion, and the wiring layer of the first buildup circuitry is electrically coupled to the first routing circuitry and the metal leads; and a second buildup circuitry that is disposed over the second surface of the encapsulant and laterally extends over the leadframe, wherein the second buildup circuitry includes at least one dielectric layer and at least one wiring layer in an alternate fashion, and the wiring layer of the second buildup circuitry is electrically coupled to the metal leads; wherein the dielectric layers of the first buildup circuitry and the second buildup circuitry further extend into a space between the electronic component and the leadframe so as to bond the leadframe to the peripheral edges of the electronic component.

2. The wiring board of claim 1, wherein the binding resin has an interior sidewall surface spaced from and bonded to the peripheral edges of the electronic component through the dielectric layers of the first buildup circuitry and the second buildup circuitry.

3. The wiring, board of claim 1, wherein the electronic component further includes an array of vertical connecting elements electrically coupled to the first routing circuitry and laterally covered by the encapsulant, and the wiring layer of the second buildup circuitry is electrically connected to the vertical connecting elements.

4. The wiring board of claim 3, wherein the electronic component further includes a second routing circuitry disposed on the second surface of the encapsulant, and the wiring layer of the second buildup circuitry is electrically connected to the vertical connecting elements through the second routing circuitry.

5. The wiring board of claim 1, wherein each of the metal leads has stepped peripheral edges it with the binding resin.

6. A method of making a wiring hoard, comprising;
providing an electronic component that includes a semiconductor device, a first routing circuitry and an encapsulant wherein the semiconductor device is electrically coupled to the first routing circuitry and laterally covered by the encapsulant, and the encapsulant has a first surface facing in the first routing circuitry and a second surface opposite to the first surface; providing a leadframe that laterally surrounds the electronic component and includes a plurality of metal leads and a binding resin, wherein the binding resin fills in spaces between the metal leads; forming a first buildup circuitry that is disposed over the first muting circuitry and laterally extends over the leadframe, wherein the first buildup circuitry includes at least one dielectric layer and at least one wiring layer in an alternate fashion, and the wiring layer of the first buildup circuitry is electrically coupled to the first routing circuitry and the metal leads; and forming a second buildup circuitry that is disposed over the second surface of the encapsulant and laterally extends over the leadframe, wherein the second buildup circuitry includes at least one dielectric layer and at least one wiring layer in an alternate fashion, and the wiring layer of the second buildup circuitry is electrically coupled to the metal leads; wherein the dielectric layers of the buildup circuitry and the second buildup circuitry further extend into a space between the electronic component and the leadframe so as to bond the leadframe to the peripheral edges of the electronic component.

7. The method of claim 6, wherein the step of providing the leadframe includes:
providing a metal frame and the metal leads, wherein the metal leads are integrally connected to the metal frame and each has an inner end directed inwardly away from the metal frame; and
forming the binding resin that fills in remaining spaces within the metal frame.

8. The method of claim 7, wherein the step of providing the leadframe further includes separating the metal frame from the metal leads after forming the binding resin.

9. The method of claim 7, wherein the step of providing the leadframe further includes forming a through opening that extends from a top surface of the binding resin to a bottom surface of the binding resin, and an interior sidewall surface of the through opening laterally surrounds the electronic component and is bonded to the peripheral edges of the electronic component.

10. The method of claim 9, wherein the step of providing the leadframe further includes providing a metal slug within the metal frame before forming the binding resin, and the through opening is formed by removing the metal slug after forming the binding resin.

11. The method of claim 6, wherein the electronic component further includes an array of vertical connecting elements electrically coupled to the first routing circuitry and laterally covered by the encapsulant, and the wiring layer of the second buildup circuitry is electrically connected to the vertical connecting elements.

12. The method of claim 11, wherein the electronic component further includes a second routing circuitry disposed on the second surface of the encapsulant, and the wiring layer of the second buildup circuitry is electrically connected to the vertical connecting elements through the second routing circuitry.

* * * * *